(12) United States Patent
Ruan

(10) Patent No.: US 10,607,807 B2
(45) Date of Patent: Mar. 31, 2020

(54) ELECTRON SPECTROSCOPY SYSTEM

(71) Applicant: BOARD OF TRUSTEES OF MICHIGAN STATE UNIVERSITY, East Lansing, MI (US)

(72) Inventor: Chong-Yu Ruan, Okemos, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 16/096,938

(22) PCT Filed: Feb. 28, 2017

(86) PCT No.: PCT/US2017/019938
§ 371 (c)(1),
(2) Date: Oct. 26, 2018

(87) PCT Pub. No.: WO2017/196434
PCT Pub. Date: Nov. 16, 2017

(65) Prior Publication Data
US 2019/0096627 A1    Mar. 28, 2019

Related U.S. Application Data

(60) Provisional application No. 62/334,534, filed on May 11, 2016.

(51) Int. Cl.
*H01J 37/075* (2006.01)
*H01J 37/26* (2006.01)
(Continued)

(52) U.S. Cl.
CPC .......... *H01J 37/075* (2013.01); *H01J 37/073* (2013.01); *H01J 37/1471* (2013.01); *H01J 37/21* (2013.01);
(Continued)

(58) Field of Classification Search
CPC ........ H01J 37/06; H01J 37/073; H01J 37/075; H01J 37/14; H01J 37/147; H01J 37/21;
(Continued)

(56) References Cited

U.S. PATENT DOCUMENTS

| 4,806,754 A | 2/1989 | Gerlach |
| 6,150,657 A * | 11/2000 | Kimoto ................ H01J 37/05 250/305 |

(Continued)

OTHER PUBLICATIONS

Kimoto, K., "Practical aspects of monochromasters developed for transmission electron microscopy," Microscopy, pp. 337-344, Aug. 14, 2014.

(Continued)

*Primary Examiner* — David E Smith
(74) *Attorney, Agent, or Firm* — Harness, Dickey & Pierce, PLC

(57) ABSTRACT

An electron spectroscopy system and method are disclosed. In another aspect, an ultrabright and ultrafast angle-resolved electron spectroscopy system is provided. A further aspect of the present system employs an electron gun, a radio frequency cavity and multiple spectrometers. Yet another aspect uses spectrometers in an aligned manner to deflect and focus electrons emitted by the electron gun. Moreover, an ultrafast laser is coupled to an electron spectroscopy system. A bunch of monochromatic electrons have their energy compressed and reoriented in an additional aspect of the present system. A further aspect of the present electron spectroscopy system employs adaptive and/or adjustable optics to optimize both time and energy compression. Another aspect provides at least two RF lenses or cavities, one before a specimen and one after the specimen.

32 Claims, 13 Drawing Sheets

(51) Int. Cl.
*H01J 37/21* (2006.01)
*H01J 37/244* (2006.01)
*H01J 37/073* (2006.01)
*H01J 37/147* (2006.01)
*H01J 49/48* (2006.01)

(52) U.S. Cl.
CPC ............ *H01J 37/244* (2013.01); *H01J 37/26* (2013.01); *H01J 37/263* (2013.01); *H01J 49/48* (2013.01); *H01J 2237/24485* (2013.01); *H01J 2237/24585* (2013.01)

(58) Field of Classification Search
CPC .......... H01J 37/26; H01J 37/263; H01J 49/48; H01J 49/04
See application file for complete search history.

(56) References Cited

U.S. PATENT DOCUMENTS

| | | | |
|---|---|---|---|
| 6,593,578 | B1 | 7/2003 | Duval et al. |
| 7,250,599 | B2 * | 7/2007 | Funnemann ............ H01J 37/05 250/281 |
| 8,440,970 | B2 | 5/2013 | Zewail |
| 8,766,181 | B2 | 7/2014 | Zewail et al. |
| 8,835,866 | B2 | 9/2014 | McGinn |
| 9,024,256 | B2 * | 5/2015 | Ruan .................... H01J 37/073 250/306 |
| 9,053,903 | B2 | 6/2015 | Zewail |
| 9,697,924 | B2 | 7/2017 | Nanni et al. |
| 2003/0085356 | A1 * | 5/2003 | Kaji ....................... G01N 23/04 250/311 |
| 2014/0131574 | A1 * | 5/2014 | Zewail ................... H01J 37/26 250/307 |
| 2018/0301317 | A1 * | 10/2018 | Luiten ................... H01J 37/073 |

OTHER PUBLICATIONS

Tao, Z., et al., "Space change effects in ultrafast electron diffraction and imaging," Journal of Applied Physics 111, 044316 pp. 1-10, Nov. 14, 2011.
Baston, P.E., "High-energy resolution electron spectrometer for 1-nm spatial analysis," Rev. Sci. Instrum. 57 (1) pp. 43-48, Jan. 1986.
Kassier, G.H., et al., "Achromatic reflectron compressor design for bright pulses in femtosecond electron diffraction," Journal of Applied Physics 105, 113111 pp. 1-10, Feb. 6, 2009.
"GIF Tridiem 863 Upgrade to Gatan Microscopy Suite 2," www.gatan.com. 2 pages, Feb. 13, 2017.
"HREM AutoTune Software," www.gatan.com, 2 pages, Feb. 13, 2017.
"TEM AutoTune Software," www.gatan.com, Feb. 13, 2017, 2 pages.
Longo, P., "Fast STEM spectrum imaging using simultaneous EELS and EDS in Gatan Microscopy Suite Software," www.gatan.com, Feb. 13, 2017, 6 pages.
Reimer, L., "Transmission Electron Microscopy," Physics of Image Formation and Microanalysis, Springer-Verlag Berlin Heidelberg GmHB, 5 pages, 1984.
"Omega Filter," Keyword Search, Glossary of TEM Terms, JOEL Ltd., www.jeol.co.jp, 2 pages, Feb. 13, 2017.
"Wien filter," Keyword Search, Glossary of TEM Terms, JEOL Ltd., www.jeol.co.jp, 2 pages, Feb. 13, 2017.
"GIF Quantum Energy Filters," www.gatan.com, Feb. 13, 2017, 5 pages.
Subramanian, S., et al., "Energy-Filtered Transmission Electron Microscopy (EFTEM) of Semiconductor Devices," EFTEM Applications, vol. 13, No. 1, pp. 20-28, 2011.
Grzelakowski, K. P., et al., "Temporal and lateral electron pulse compression by a compact spherical electrostatic capacitor," Ultramicroscopy 130, pp. 36-43, 2013.
Flory, C. A., et al., "Analytic expression for the ideal one-dimensional mirror potential yielding perfect energy focusing in TOF mass spectrometry," International Journal of Mass Spectrometry and Ion Processes 152, pp. 177-184, 1996.
Teng, J. et al., "Beam collimating and energy spectrum cpmpression of laser-accelerated proton beams using solenoid field and RF cavity," Nuclear Instruments and Methods in Physics Research A 729, pp. 399-403, Mar. 26, 2013.
Winfield, J.S., et al., "A versatile high-resolution magnetic spectrometer for energy compression, reaction studies and nuclear spectroscopy," Nuclear Instruments and Methods in Physics Research A 704, pp. 76-83, Sep. 14, 2012.
Ruan, C., "From Neutrinos to Liquid Clusters, Structure Investigations by Electron Scattering and Related Methods," Dissertation, The University of Texas at Austin, pp. 23-26, May 2000.
Reddish, T.J., et al., "Dual toroidal photoelectron spectrometer for investigating photodouble ionization in atoms and molecules," Rev. Sci. Instrum. 68 (7), pp. 2685-2692, Jan. 2, 1997.
"Energy-Filtered Transmission Electron Microscopy," www.microscopy.ethz.ch, 2 pages, Mar. 30, 2016.
"Toroidal RF Ion Trap Mass Analyzer," http://web.ornl.gov, 2 pages, Apr. 25, 2016.
Chun-Kai, X., et al., "A double toroidal analyzer for scanning probe electron energy spectrometer," Chin. Phys. B., vol. 23, No. 7, 073402 pp. 1-5, Feb. 26, 2014.
Farnell, C. C., et. al., "Electrostatic Analyzers with Application to Electric Propulsion Testing," 33rd International Electric Propulsion Conference, The George Washington University, Washington D.C., pp. 1-48, Oct. 6-10, 2013.

\* cited by examiner

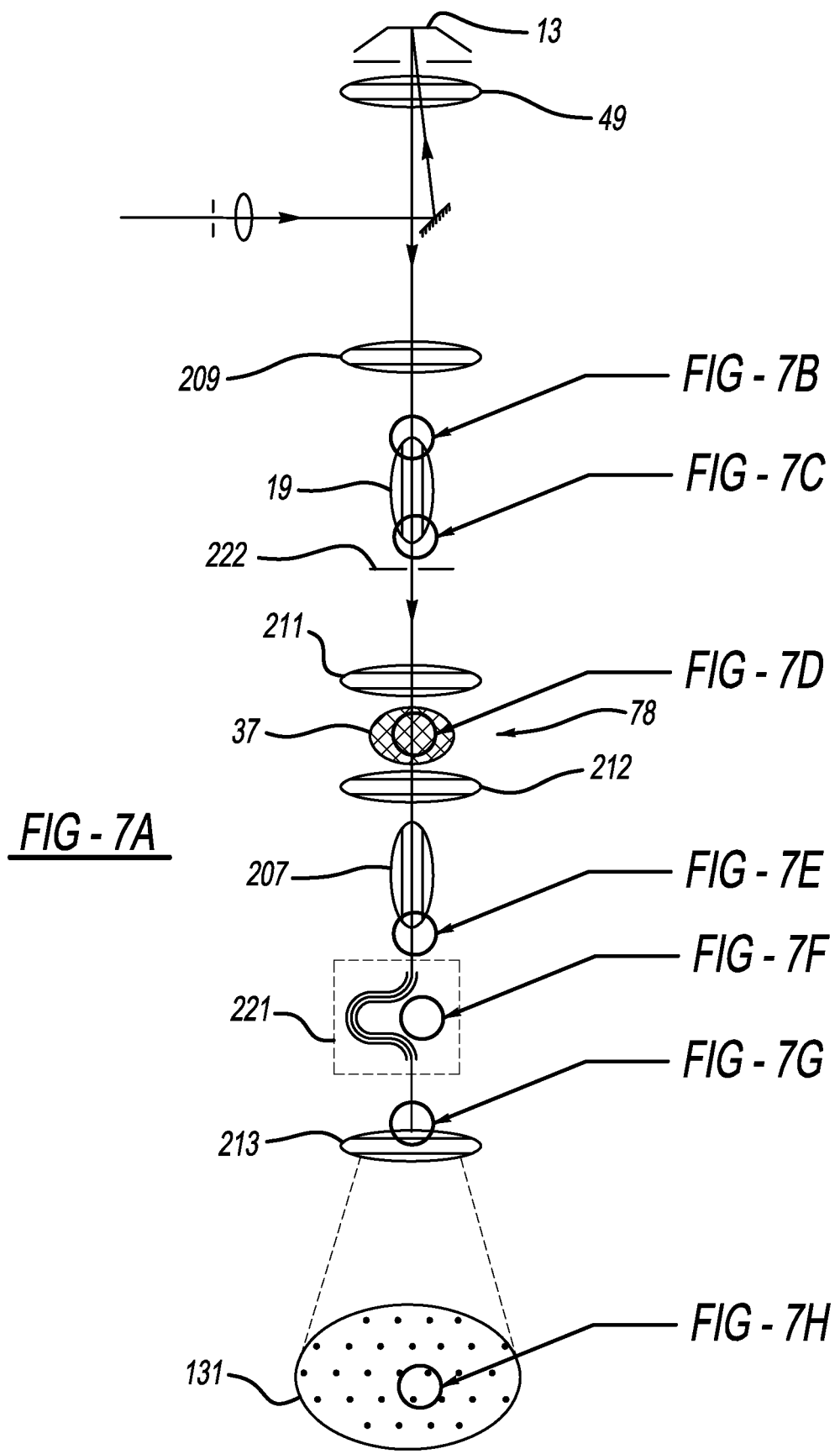

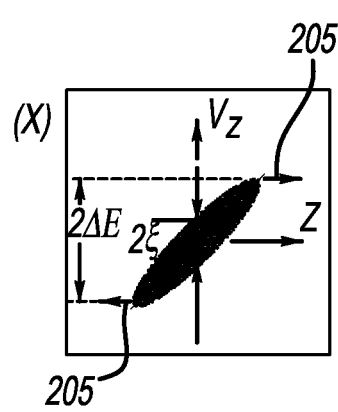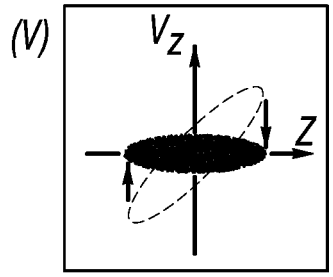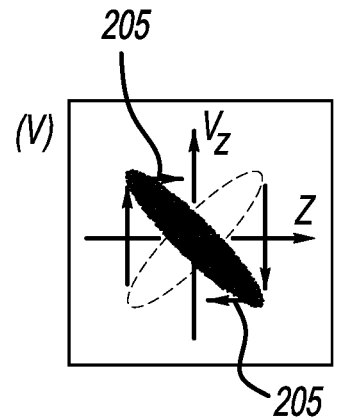
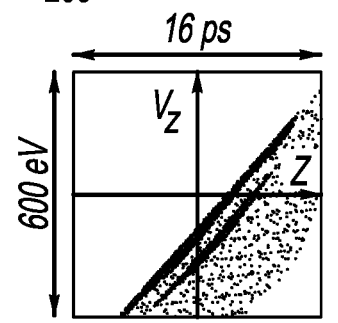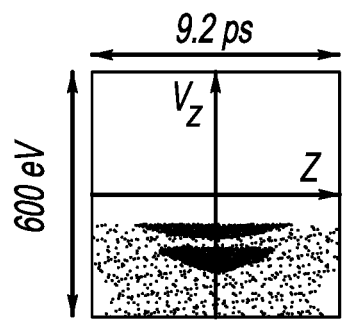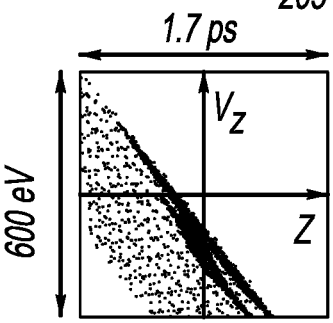
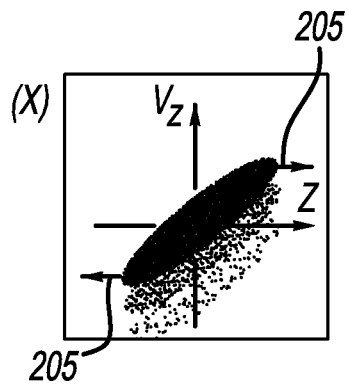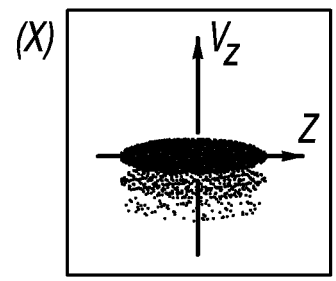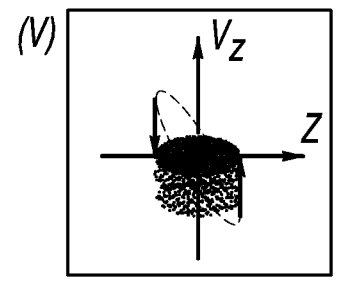
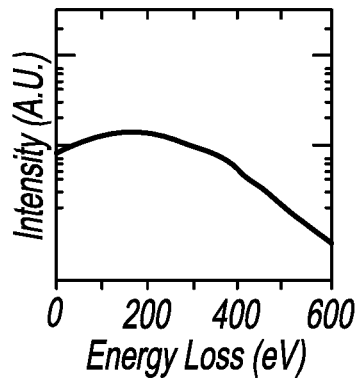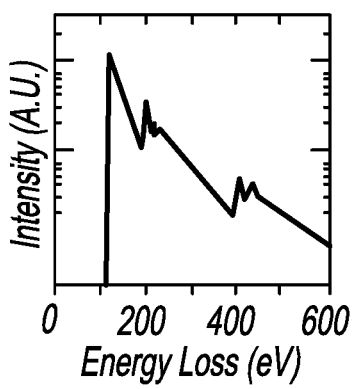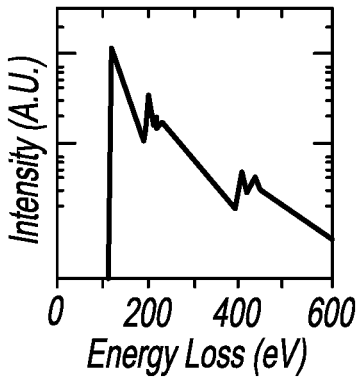
*FIG - 8A*     *FIG - 8B*     *FIG - 8C*

ELECTRON SPECTROSCOPY SYSTEM

CROSS-REFERENCE TO RELATED APPLICATIONS

This application is a National Phase Entry of International Patent Application No. PCT/US2017/019938, filed Feb. 28, 2017, which claims priority to U.S. Provisional Application Ser. No. 62/334,534, which was filed on May 11, 2016, both of which are incorporated by reference herein.

GOVERNMENT CLAUSE

This invention was made with government support under DMR1625181 awarded by the National Science Foundation. The government has certain rights in the invention.

BACKGROUND AND SUMMARY

The present disclosure relates generally to electron spectroscopy and more particularly to an electron spectroscopy system including a radio frequency cavity and multiple spectrometers.

The ability to control and engineer complex materials and nanostructures is essential for enabling an array of technologies including: solar-energy harvesting, solar to fuel conversion, heat recovery, and the development of novel photoactive nanostructured materials and nanoelectronics devices used in computing and internet infrastructure. It is widely recognized that a major bottleneck to progress is the scarcity of experimental data on the local properties, which has prevented the successful development and validation of advanced predictive models. Information about collective excitations, such as plasmons, and low-energy excitations, which involve holes and electrons in the valence and conduction bands, can be inspected in the low-energy loss region. However, such information is usually very difficult to obtain as it often involves multiple steps and collective modes that are frequently not accessible via optical devices. These different transient responses highlight the complexity of charge transfer dynamics at heterogeneous interfaces consisting of active plasmonic nanostructures, surface and dielectric medium over different frequencies and timescales. The traditional shortcomings in resolving these processes are exacerbated by the limitations in terms of temporal resolution and sensitivity using only a single or very few electrons in each electron gun pulse or shot with conventional electron microscopes.

Strongly correlated electronic materials are promising candidates to provide new functionality that cannot be found in conventional semiconductors and metals, in part because of their complex types of ordering. The tendency for their complex ordering, which leads to highly remarkable and important properties such as high-Tc superconductivity and giant magnetoresistance, arises because correlated matter very often exists close to several different types of ordered phases due to complex interactions between the orbital states of localized electrons and the distortion of ionic lattices. Understanding the fundamental excitations near the phase-transition threshold between different states is central to not only strongly correlated materials, but also the science to synthesize and process them. The collective excitations that emerge near these thresholds often exhibit complex spatiotemporal patterns that are different from conventional semiconductors or metals, such as density waves and macroscopic charge orders. While advances in ultrafast imaging technology are now at the level where these spatiotemproal pattern may be imaged using ultrashort coherent X-ray beams or with coherent electron beams on the ultrafast timescale, the still existing challenge is to correlate these spatiotemporal patterns with their underlying electronic structure evolution that is the primary source of their functionalities. However, the most advanced laser-based femtosecond ("fs") angle-resolved spectroscopy for imaging band structures, namely ultrafast angle-resolved electron spectroscopy, is limited by its use of low energy electrons to two dimensional ("2D") Fermi surfaces and Brillouin zones. Meanwhile, a major challenge in this field is now reconciling the emerging properties due to macroscopic entanglement between different electronic orderings since such transformations not only depend on the properties of 2D electronic distributions, but also the interaction of the density waves through structures across the layers.

Furthermore, electron energy-loss spectroscopy ("EELS") is employed in high time-resolution transmission electron microscopy ("TEM") as a new ultrafast probe for studying element-specific and local electronic processes, whereby it is desirable to reach a high overall signal strength as reproducible events in this regime typically correspond to less than a few percentage changes in the electron density and chemical bonding. The most challenging issue thus far preventing wide-ranging applications of ultrafast EELS is the presence of space-charge effect resulting in poor time and energy resolutions in TEM. The alternative solution to this is to use only one or few electrons in each electron packet complemented by a high-repetition rate (typically ~MHz) to preserve the inherent resolutions (typically ~0.6 eV-500 fs, limited mainly by initial stochastic velocity spread at photoemission) in ultrafast electron microscopes ("UEM"). Whereas this approach is ideally suited for imaging highly reproducible electronic processes, as in many applications in photon-induced near-field electron microscopy mode and has been applied to study band-edge renormalization at low-loss regions, a higher instantaneous dose is desired for imaging more chemically sensitive core-level spectroscopy. Not only is the cross-section in core losses much lower, many applications involving chemical transformations and bonding changes are also typically less reproducible, thereby demanding orders of magnitude improvements in the instantaneous dose.

In accordance with the present invention, an electron spectroscopy system and method are disclosed. In another aspect, an ultrabright and ultrafast angle-resolved electron spectroscopy system is provided. A further aspect of the present system employs an electron gun, a radio frequency cavity and multiple spectrometers. Yet another aspect uses spectrometers in an aligned manner to deflect and focus electrons emitted by the electron gun. Moreover, an ultrafast laser is coupled to an electron spectroscopy system. A bunch of monochromatic electrons have their energy compressed and reoriented in an additional aspect of the present system.

The present electron spectroscopy system and method advantageously enhance temporal and momentum resolution, and throughput to ultimately allow studies of individual nanostructures with full three-dimensional ("3D") momentum resolution over an entire Brillouin zone. Such capabilities are currently not available in conventional electron-based spectroscopy systems. An advantageous foundation of the present ultrabright monochromatic electron beams is through active energy compression to preserve the throughput of the beam for materials research. Furthermore, the innovative present tandem spectrometer system achieves high momentum and energy resolution from 0.1 eV to 10 eV for low-loss and core-loss electron spectroscopy with fs-ps time resolution, which are not obtainable with conventional electron microscopes or spectrometers. The present system will extend ultrafast material spectroscopy studies to the realm of characterization of transient three-dimensional electronic structures with unprecedented sensitivity.

The high-throughput of the present system is the ideal probe for unveiling transient photochemical processes due to its high sensitivity to charge states and its more direct accesses to local electronic structures and hot electron dynamics for pinpointing the origins of these local, transient electronic processes. In addition, the local structure can be extracted by analyzing the extended energy loss fine structure, which is an analogue of extended X-ray absorption fine structure.

The present system advantageously provides full-scale 3D momentum spectroscopy by high-energy beams that penetrate the bulk of samples and the ability to sample large energy dispersion and momentum distribution. Beyond correlated electron physics, the high momentum and high time-resolution spectroscopy established through the present system provides new capabilities relevant to understanding an array of complex materials issues of broad interest, including studies of high-temperature superconductors, topological insulators, materials exhibiting photo-induced phase transitions, and novel correlated-electron-based switching devices. Furthermore, the present system has capabilities for in-situ, ultrafast characterization of transient processes and phases. This ability for precisely tracking material modifications of carbon-based materials into a variety of novel phases induced by irradiation is demonstrated in the distinctive core-level spectra of these different phases when the energy window is tuned to the carbon K-edge. An additional use of the present system is for analysis of emergent behavior of matters under extreme environments. Moreover, the development of the present RF-enabled system is a significant step towards reaching effective brilliance and time-resolution as free-electron laser X-ray beamlines for spectroscopy.

Conventional momentum-resolved spectroscopy typically requires X-ray or electron probes due to the low momentum transfer at optical frequencies. In comparison to some traditional laser-based electron spectroscopy systems, namely angle-resolved photoelectron spectroscopy and photoelectron electron microscopy, the present approach is highly complementary and excels in providing higher throughput enabling studies of materials processes where high-repetition-rate experiments are not feasible.

A further aspect of the present electron spectroscopy system employs adaptive and/or adjustable optics to optimize both time and energy compression. Another aspect provides at least two RF lenses or cavities, one before a specimen and one after the specimen. Still another aspect includes a programmable controller and associated software instructions which automatically optimize and/or adjust multiple lens in a laser based electron microscope while images are being produced for a specimen. These aspects of the present system improve both the time and energy resolution of the microscope and the detail of the image created therewith. Additional advantages and features can be found in the following description and appended drawings.

BRIEF DESCRIPTION OF THE DRAWINGS

FIG. 7A is a diagrammatic longitudinal view showing the second embodiment of the electron spectroscopy system;

FIGS. 8A-C are sets of phase space representations of electron pulses in the second embodiment of the electron spectroscopy system;

DETAILED DESCRIPTION

Figure 1:
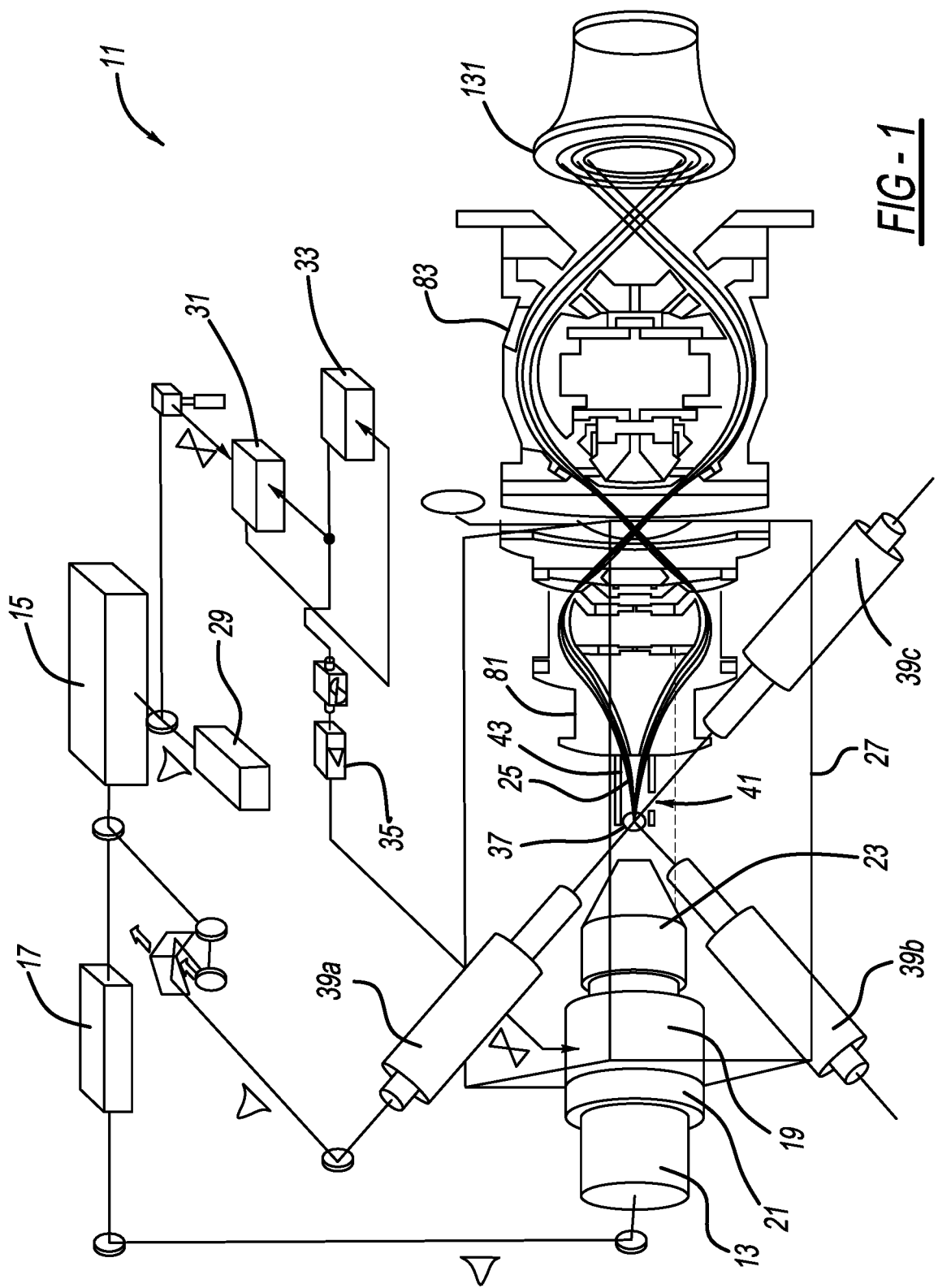
FIG. 1 is a diagrammatic side view showing an electron spectroscopy system.
Figure 2:
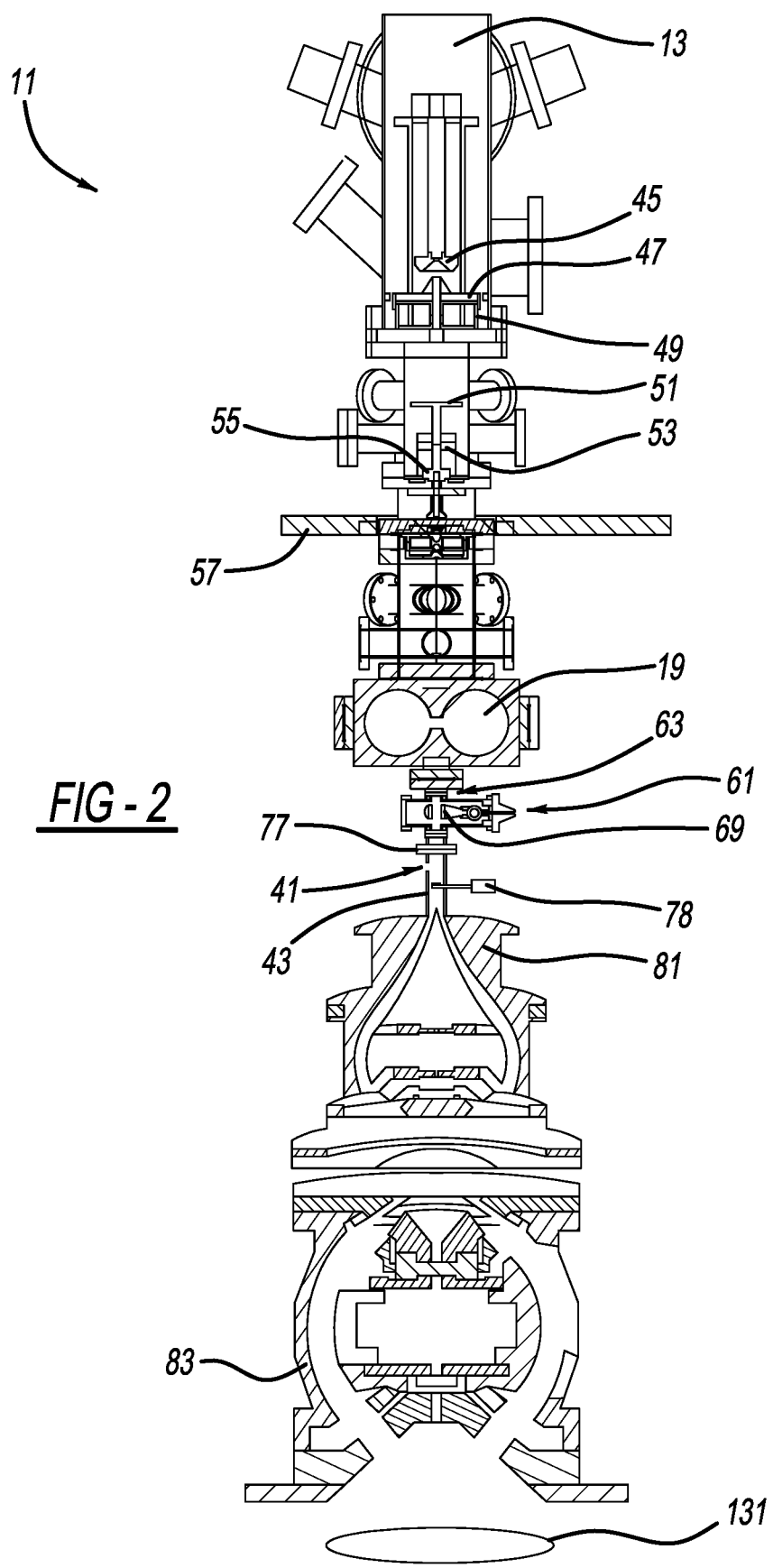
FIG. 2 is a longitudinal sectional side view showing the electron spectroscopy system.

A first embodiment of an electron spectroscopy system 11 is shown in FIGS. 1 and 2. System 11 includes a femtosecond photoelectron gun 13, which is driven by a fs laser 15 and harmonic generator pulse shaper 17 for high-brightness beam generation. System 11 further includes an energy-compression radio frequency ("RF") cavity 19. RF cavity 19 is coupled to gun 13 through mode-matching optics 21 and an energy filter 23 to produce and emit monochromatic electron beams 25, containing a bunch of electrons in each pulse or shot, for the spectroscopy process in a vacuum chamber 27.

System 11 also includes a seed fs oscillator 29, a phase-lock loop 31, a master RF clock 33 and an RF amplifier 35. Laser pulses of 1 ps or less are preferred for sending to gun 13 and also to a specimen or sample 37. Even more preferable, 100 fs or less duration laser pulses are employed. The laser pulses are emitted from any one or more of time-resolved optical pumping members 39a, 39b and/or 39c, members 39b and 39c being optional, through a window 41 in a side of a column 43. The ultrafast laser, laser beam shaper, radio frequency gun, and RF cavity are preferably of the type disclosed in U.S. Pat. No. 9,024,256 entitled "Electron Microscope" which was invented by C. Ruan et al., and is incorporated by reference herein.

Gun 13 includes a 100 kV Pierce geometry cathode 45, a 100 kV Pierce geometry anode 47, an ML1 condenser 49, an electron beam shield 51, a 266 mirror mount 53 with a first aperture, and a first deflector 55. Gun 13 emits at least $10^3$ electrons per bunch or shot.

The RF system is powered by the low-noise, all solid-state amplifier 35 synchronized to the electron and laser pulses to within 100 fs precision. Photogun 13 for the present system optimizes the Pierce gun geometry to increase the extraction field at the photocathode from 4 MV/m to 10 MV/m (practical breakdown limit) while compensating for the divergence of the beam with a magnetic lens that proximity-couples to the Pierce gun, so a factor of two in longitudinal brightness near the virtual cathode limit is gained. Such an implementation will enable <1 kHz rate pump-probe spectroscopy, instead of the more typical 10 kHz-MHz rate in some current ultrafast setups. This advantageously provides a robust system to tackle chemical bonding changes and phase transitions that are driven with the present more intense laser with ms or longer recovery time.

Furthermore, energy resolution is improved at the limit where the near-cathode stochastic space-charge effect is not dominating and higher repetition rate is possible, such as in the studies of plasmonic processes and electron dynamics at interfaces. One alternative is to utilize a sharp cathode geometry rather than a flat one which could have a lower emittance with a dilute beam (<100 electrons per pulse). In such a scenario, the initial pulse width and longitudinal velocity spread can be controlled near the single-electron direct photoionization case due to the low-level space-charge effect facilitated by the low density and the strong local field. This scenario is ideally suited for high resolution spectroscopy.

The UV laser pulse shaping capability allows a high-degree of control over the initial pulse's longitudinal phase space. The energy compression available in the present system will allow a dynamic adjustment of the phase space to match with desired initial conditions so that an optimal condition for spectroscopy can be achieved. Furthermore, good time resolution may be obtained through manipulating the chirped phase at the sample plane. This flexible control both in the initial and evolutionary part of the beam dynamics allows for studying quantum optical effects pertaining to coherent beam generation, including utilizing the plasmonic evanescent wave field to entangle different optically generated superpositions of momentum states to ultimately achieve atto-second pulses. Accordingly, the availability of a high-resolution spectrometer and 2D area detector in the present system provides a diagnosis system for such a development.

The RF technology for controlling the high-intensity electron beam optimizes the electron pulses' phase-space-density (brightness) projected in the resolution window caused by the space-charge effects. In implementing the optimal design of the RF cavity, the nonlinear and stochastic effects will determine the ultimate compressibility of the full beam dynamical phase space. Beam slicing schemes between the longitudinal phase space and the horizontal phase space, before and after the RF cavity, allows extraction of the optimal portion of the phase space for spectroscopy applications. Multilevel fast multipole method ("MLFMM") beam dynamics simulation capability is coupled with a Warp code, which has the capability of considering wakefield effects that may be present in the electron beamline when the electron pulses are close to a surface, for designing the apertures used in restricting the phase space.

RF cavity 19, used for energy compression, is preferably constructed using oxygen free high conductivity copper. This cavity achieves a high quality factor (e.g., 20,000 without load, and 15,000 under a load of 1 kW) at ~1 GHz that is tunable to match with the reference signal provided by the laser oscillator. Thermal stability is reached in using cavity 19 for energy compression due to the significantly reduced power consumption compared to prior time-compression, from 350 W to less than 100 W at 100 keV electron pulse energy. The lower power consumption allows an experiment to run with a duty cycle of 1, which will greatly improve the stability of the phase-locking between the electron pulse (controlled by fs laser 15) and the RF electronics. An all-solid-state amplifier system combines and synchronizes the amplified RF, capable of delivering 3 kW and avoiding the use of a waveguide, which simplifies the delivery of the RF capability. To achieve an accuracy of 0.1 eV, the arrival time jitter is maintained to the level of $10^{-6}$ for the power supply of the DC gun. Moreover, high harmonic signals extracted from the output of the femtosecond laser oscillator will be synchronized to the RF amplifier via a voltage controlled oscillator in a phase-locked loop ("PLL") design, to achieve a high accuracy in synchronizing femtosecond electron and laser pulses.

A PLL for laser-RF synchronization is based on locking the RF to the high harmonic of the laser oscillator, resulting in a phase noise at the level of 50 fs, after temperature-stabilizing a low-level RF ("LLRF") circuit to within 10 mK. At the RF cavity, water cooling and an active thermoelectric temperature stabilization maintain the temperature within 100 mK, leading to effective rms phase jitter at ~100 fs at a load of 450 W, compared to free running with active temperature compensation at ~500 fs. The target beam energy is in the range of 10-30 keV, which will reduce the power consumption by an additional factor of three to ten. Locking the RF at 1 GHz or higher in the PLL and implementing a secondary PLL to control the thermoelectric cooling/heating unit based on the feedback from the reflected RF power off the directional coupler provide electronic phase stability. Operation at the 10-50 fs level with energy resolution at 0.4-2 eV is expected if the full pulse phase space is used. An energy filter 61 selects the desired energy window (with a reduction of beam intensity) for an experiment in most applications that require even higher energy resolution. As a result, the impact of the energy fluctuations due to phase jitter will be scaled down accordingly.

Inline energy filter 61 is located between RF cavity 19 and column 43. An exemplary energy filter is a Wien filter including alignment deflection coils 63, an electric field plate coupled to a magnetic field yoke 69, and a stainless steel canister. One such Wien filter is discloses in Batson, P., "High-energy Resolution Electron Spectrometer for 1-nm Spatial Analysis," Rev. Sci. Instrum. 57(1), January 1986, pp. 43-48.

The bunch of electrons subsequently passes from filter 61 through a condenser lens 77 with an electric coil, which selects a beam energy window and directs the electron bunch onto specimen 37 mounted on a copper grid of a removeable specimen holder 78. The electrons passing therefrom are focused by an objective lens and subsequently pass into a toroidal spectrometer 81.

The distribution of the scattered electrons from the samples is angle- and energy-analyzed by toroidal spectrometer or analyzer 81, and a co-axially aligned spherical spectrometer or analyzer 83, arranged in tandem (i.e., spherical spectrometer 83 is downstream of toroidal spectrometer 81) in a single column arrangement to accomplish high momentum and high energy resolution. An exemplary toroidal analyzer is disclosed in U.S. Pat. No. 7,250,599 entitled: "Energy Filter Image Generator for Electrically Charged Particles and the use thereof" which issued to Funnemann et al., on Jul. 31, 2007, and is incorporated by reference herein. Other exemplary monochromator analyzers for electron microscopy are disclosed in Kimoto, K., "Practical Aspects of Monochromators developed for Transmission Electron Microscopy," Microscopy, Vol. 63, No. 5 (Aug. 14, 2014), pp. 337-344.

Figure 3:
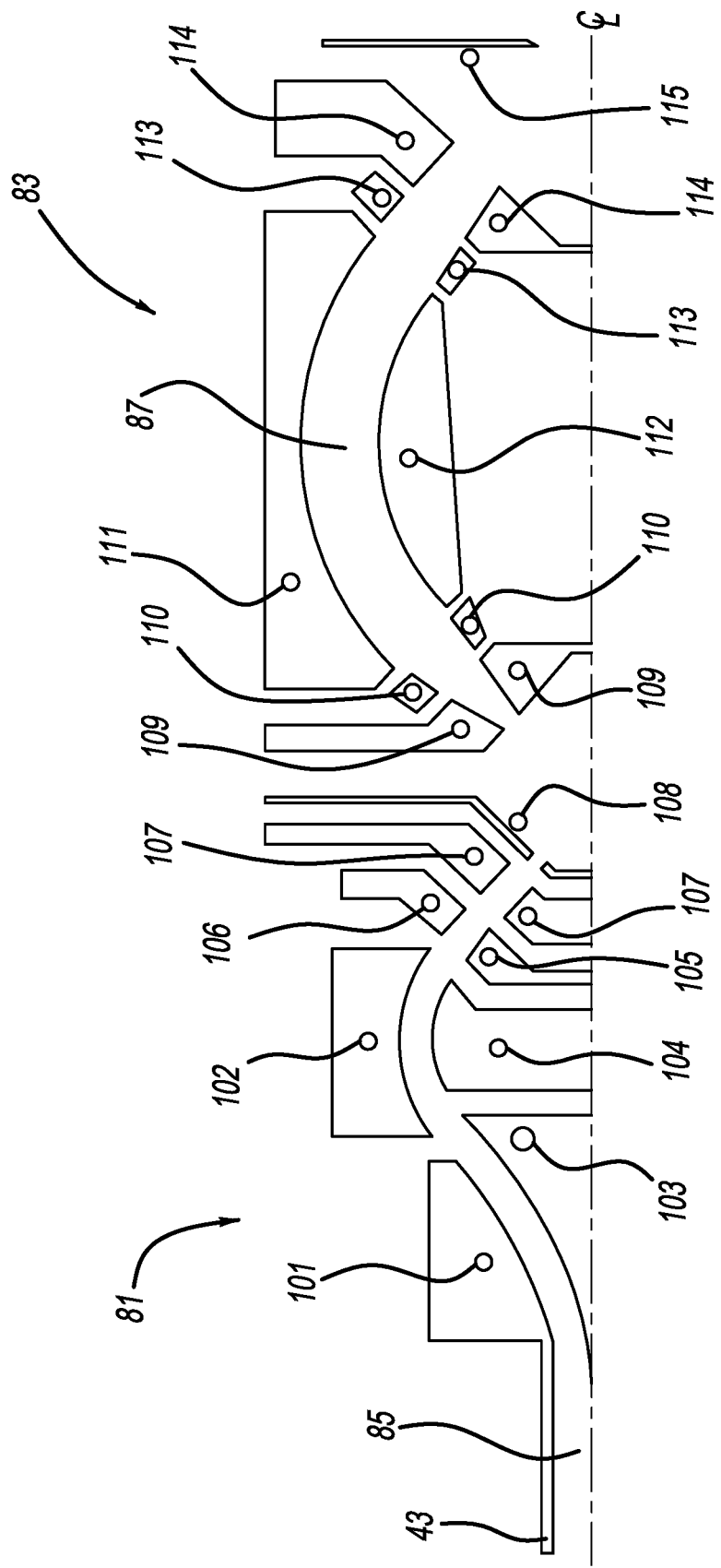
FIG. 3 is a diagrammatic enlarged view showing a toroidal analyzer and a spherical analyzer employed in the electron spectroscopy system.
Figure 5:
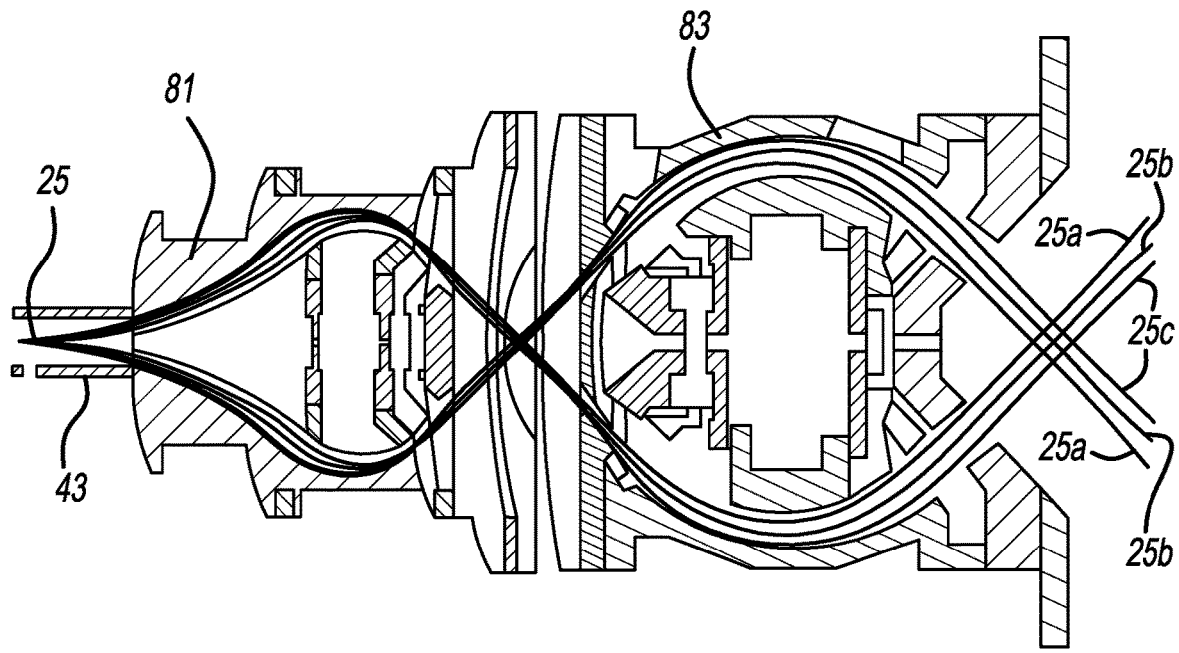
FIG. 5 is a longitudinal sectional view showing the toroidal analyzer and the spherical analyzer employed in the electron spectroscopy system.

Referring to FIG. 3, spectrometers 81 and 83 include housings within which are arcuate, onion dome shaped paths 85 and 87, respectively, located outboard of a longitudinal centerline CL. Multiple electrodes 101-115 somewhat surround each adjacent section of the paths in an annular manner. Referring to FIGS. 3 and 5, the electron spectrometer system parameterization is based on analyzing 20 keV primary beams. The nominal potentials (in keV) for electrodes 101-115 are: $V_{101}=V_{102}=0$, $V_{103}=-2.53$, $V_{104}=10.11$, $V_{105}=0$, $V_{106}=1.83$, $V_{107}=2.15$, $V_{108}=V_{109}=0$, $V_{110}=4.84$, $V_{111}=0$, $V_{112}=16.88$, $V_{113}=4.84$, $V_{114}=V_{115}=0$.

The $2\pi$ full-angle electron spectra are projected as concentric, generally circular ring patterns on an area detector 131 with single-electron counting capability. Detector 131 is part of a CCD camera connected to a programmable computer. For ultrafast studies, the synchronized laser pulses will initiate the events and the ensuing electronic processes are probed by electron spectrometers with 0.1-to-1 eV and femtosecond-to-picosecond resolutions depending on the intensity of the beams and the target energy window.

Figure 4:
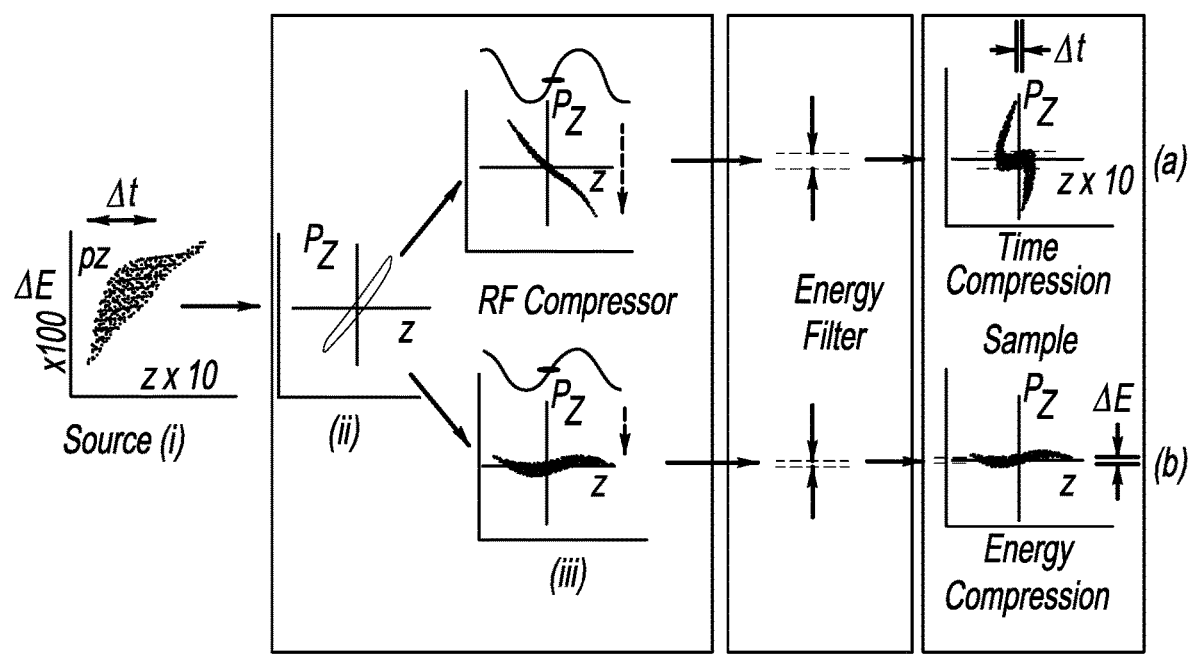
FIG. 4 is a diagram showing electron pulse phase-space manipulation of the electron spectroscopy system.

The present system provides energy compression of the space-charge-dominated incident beam 25 generated from a high-brightness electron source. This is accomplished by carefully adjusting a strong oscillating RF field from RF cavity 19, to rotate the phase space of electron pulse 25 so that the majority of the electrons in the pulse are squeezed into a narrow energy window when incident upon the samples, as shown in FIG. 4. Time-compression of electron beams for femtosecond electron diffraction, such as that in Ruan U.S. Pat. No. 9,024,256, is illustrated in the upper row (a) of FIG. 4. In contrast, energy compression of the present system takes advantage of the fact that the main part of the space-charge-led energy spread is a correlated effect, which manifests as a chirping in the longitudinal phase space (the pz and z plane), developed naturally during the drift period, illustrated from (i) to (ii) at the lower row (b) in FIG. 4. Given that the phase space area is largely conserved in the process (Liouville's theorem), the correlated space-charge effect helps reduce the local energy spread of the chirped pulse. Precise control using the phase-locked RF field to rotate the longitudinal phase space so the chirp-axis is aligned with the beam axis (z), illustrated at stage (iii), allows the overall pulse's energy spread ($\Delta E$) to be reduced to the level of the initial pulse, if the stochastic and nonlinear components of the space charge spreading are under control.

Angular and energy components of the inelastically scattered electrons from the samples are analyzed in order to determine the energy loss spectra. The target is fully 3D spectra (momentum-resolved), which carries information about the entire band structure. The momentum resolution is limited by the angular resolution of the spectrometer. Although utilizing high-energy beams provides a large energy scale for characterizing the entire band structure, the momentum change needed to resolve the full Brillouin zone of the electron wave-vector in materials is reduced to very small angular shift. For example, the $1^{st}$ BZ boundary corresponds to $\leq 1°$ range when using 30 keV electron beams.

High-momentum and high-energy resolution are accomplished by combining toroidal analyzer 81 and spherical analyzer 83, as shown in FIGS. 2 and 5. In this tandem design, toroidal analyzer 81 in the first stage has a unique geometry to provide an azimuthal angular magnification in order to boost the effect of transverse momentum transfer, while also acting as an energy filter that can be used to select a specific spectral window to be passed on to the following spherical analyzer 83, where fine energy structure is analyzed in detail. These analyzers are operated in focusing and deflecting modes with the focal distance controlled and matched by Herzog lenses in the entry and exit ports. This arrangement allows more spectrometers to be added in sequence if needed to improve the resolution without significantly sacrificing the throughput.

TABLE I

| Electrons per pulse | Normalized emittance ($\varepsilon_z$) (μm) | Target time resolution (ps) | Low loss acquisition time (sec) with $\geq 100$ e/0.1 eV @ 1 kHz | Core loss acquisition time (sec) with $\geq 100$ e/10 eV @ 1 kHz |
|---|---|---|---|---|
| $10^7$ | $1.7 \times 10^{-1}$ | 50 | 1.0 | 3.46 |
| $10^6$ | $8 \times 10^{-3}$ | 10 | 2.5 | 8.15 |
| $10^5$ | $3 \times 10^{-4}$ | 1 | 9.2 | 30.6 |
| $10^4$ | $9.5 \times 10^{-6}$ | 0.25 | 11.6 | 38.7 |
| $10^3$ | $1 \times 10^{-6}$ | 0.25 | 12.2 | 40.8 |

Table I sets forth the estimated source-limited performance figures of the present system based on the electron beam brightness calculated using MLFMM. The determination of the acquisition time is based on the ratio of the typical EELS loss signals and the zero loss intensity. This ratio is nominally $7 \times 10^{-4}$ at the low-loss level and $2 \times 10^{-6}$ at the core-loss level. Based on the phase space density, the performance figure of merit ("FOM") can be determined based on the calculated signal-to-noise ratio over the intended resolution window per second. Table I further shows the required data acquisition times based on FOM for valence (shown in column 4) and core-level (shown in column 5) spectroscopy are estimated based on a 1 kHz repetition rate. The estimated timescales to reach signal-noise-ratio of 10 for most scenarios are in the range of seconds. This indicates there is a good degree of flexibility in designing the pump-probe experiments through optimizing the complementary energy and time resolutions at 1 kHz or lower repetition rate. For example, in studying electronic processes the ultrafast transformations are frequently fully reversible at a high repletion rate with very small residual effects, so the optimal experimental conditions may be achieved by using a low electron dose per pulse and a high repetition rate to preserve the beam quality while achieving high energy and temporal resolutions. For researching material transformation in extreme environments, the experiments may be limited by the requirement of achieving single-shot operation given that the processes are most likely irreversible, and the optimization is to be chosen between the energy and the temporal resolution.

Conventional ultrafast studies of materials typically rely on pump-probe schemes, in which an ultrashort laser pulse is used to initiate the event and the ensuing materials' responses are investigated by the probing pulses (X-ray, photon, electron etc.). Embedded in such a scheme is the need to repeat the events so that the response signals over iterative pump-probe cycles enable the buildup of a signal-to-noise ratio of sufficient fidelity. One of the current limiting factors is the recovery time of the material processes, which sets a limit on the applicable repetition rate of the system.

Utilizing an ultrafast high-brightness electron beam of the present system, however, enables significant reduction of the repetition rate, which is typically in the MHz range. This capability will extend studies to include strongly driven conditions, photo-induced phase transitions and materials in extreme environments. This is achieved by the high-brightness beam generation and its preservation. The present system advantageously employs the multilevel fast multipole method for the electron beamline, which can accurately capture the space-charge effects and determine the performance figures of the beamline. An emittance measurement, determined using the Pepper-Pot method at the sample plane along the electron beamline, shows that the transverse emittance is within 40% of that predicted by the model. The most significant emittance growth occurs in the accelerating phase after the photoemission stage, and using different laser pulses to shape the initial electron pulse profile at the photocathode can control the terminal emittance. The sensitivity to initial conditions opens up new avenues for controlling the beam dynamics using femtosecond pulse-shaping techniques.

Electrodes 101-115 of spectrometer 81 and 83 cause electron beam streams 25a, 25b and 25c, by way of non-limiting diagrammatic examples, to angularly diverge from each other as they arcuately travel along their paths or channels 85 and 87. The angular momentum of these different electron streams will terminate at different lateral locations spaced away from centerline CL, when they are received by CCD camera detector 131.

A second embodiment of the present electron spectroscopy system 201 is disclosed in FIGS. 6-13. System 201 includes adaptive electron-optics in an electron microscope 203 aiming to boost a signal-to-noise ratio ("S/N") while maintaining high energy and time resolutions in a few-electron pulse UEM system. A pair of longitudinal electron lenses or RF cavities 19 and 207 control the pulsed electron beams, resulting in favorable phase space evolution to improve resolutions and overcome space-charge limitations. Transverse magnetic lenses 49, 209, 211, 212 and 213 are also part of the TEM. Magnetic lens 49 is proximity-coupled to gun 13 to more easily control the incidence beam divergence angle for the subsequent lenses. Moreover, magnetic lenses 211 and 212 form the objective lens system. Lens 211 helps control the dose of the electron beam on the specimen, while lens 212, coupled with lens 213, controls magnification for image projecting. An omega filter type of spectrometer analyzer 221 is in the TEM column between RF lens 207 and magnetic lens 213; omega spectrometer 221 includes four electromagnets arranged in the general shape of the letter omega. The omega spectrometer, however, may be replaced by a magnetic prism type spectrometer, such as GIF Quantum® (from Gratan, Inc.), a Wien filter or other such analyzers. A specimen is positioned on a holder in receiving area 78, an aperture 222 is located between RF lens 19 and magnetic lens 211, and a camera 131 is in a lower viewing or detection chamber.

To understand the basic principle, the progression of the pulses in terms of phase space at pulse's rest frame is hereinafter described with reference to FIGS. 8A-C. Specifically, the commonly known space-charge effect can be understood in terms of the projection of the phase space along the $v_z$ and z axes. In a space-charge-dominated beam, the phase space is strongly elongated to produce large axial projections, representing significant energy and time spreads measured in a laboratory frame. However, the phase space evolution is dynamic and can be controlled via suitable electron optics. Therefore, only the phase space area or emittance ultimately limits the resolution. This is exemplified in the traditional TEM column design where the source brightness, which is related to beam current divided by transverse emittance, is the figure of merit for generating focused/coherent beams for imaging and diffraction experiments. Nevertheless, the longitudinal optical design relevant to improve energy and time resolutions in a TEM has not been realized in prior designs.

The emittance growth, an important but more subtle form of the space-charge effect, has been studied with the N-particle simulations using the multi-level fast multiple method. In high-energy beam extraction, the emittance growth is most prominent at the early stage and reaches a terminal value as the pulse's internal dynamics establishes a steady-state flow. Therefore, the most frequently discussed space-charge-led broadening in electron beam systems is led by the pulse's internal velocity dispersion obtained prior to the steady state. Severe nonlinearity in the phase space can be avoided under proper arrangements of an extraction field and initial pulse envelope, especially in the core area of the phase space that can be extracted with different pulse slicing techniques. Within this context, the longitudinal phase space evolution is modelled using a linear structure, where the phase space is characterized by normalized emittance $\varepsilon_z$, chirp $a_z$ ($a_z \equiv dv_z/dz$, representing tilting of the phase space), and pulse width $\Delta t_0$.

TABLE 2

| Number of electrons per pulse $N_e$ | Longitudinal emittance $\varepsilon_z$ (micrometer μm) | Longitudinal phase space chirp $a_z$ (ps$^{-1}$) | Pulse-width $\Delta t_0$ (ps) |
|---|---|---|---|
| $10^5$ | 0.0005 | 0.00035 | 1.5 |
| $10^6$ | 0.01 | 0.00030 | 4.4 |
| $10^7$ | 0.2 | 0.00024 | 11 |

Table 2 lists typical $N_e$-dependent longitudinal phase space parameters (i.e., input parameters stored in the computer's random access memory as part of the active tuning program) of space-charge-dominated beams generated from femtosecond photoelectron sources entering into the present electron microscope column. These parameters serve as the conditions for initiating the pulse's dynamics under the electron-optical manipulation in the present TEM simulations. If uncorrected, their projected time and energy spreads at the specimen range 3 ps-100 eV for $N_e=10^6$, 8 ps-350 eV for $N_e=10^6$, and 20 ps-600 eV for $N_e=10^7$. These values are typical for space-charge-dominated beams. The longitudinal emittance is essentially phase space volume while the longitudinal phase space chirp is also a configurational tilt of the electron phase space such as in FIG. 7B. To benchmark the improvement in performance with the present adaptive optics, the cases where such correction optics are not enacted are first simulated. Such a scenario is shown in FIG. 8A, where the internal dispersion of the phase space leads to broadening of the pulses (see arrows 205) over time. In the lab frame, one can establish the respective spreads $\delta t=k_t\delta z$, $\delta E = k_v \delta v_z$, where for a 100 keV electron beam, $k_t$ and $k_v$ are 0.00509 ps/μm and 1117 eV/(μm/ps), respectively. A notable chirp $a_z = k_t/k_v \times \delta E/\delta t$ can develop, typically in the range of 0.0002 to 0.0004 ps$^{-1}$ for $N_e = 10^5\text{-}10^7$.

The concept of ultrafast EELS with high-intensity electron pulses is shown in FIGS. 8A-C. The top row is at RF lens 19 (LL1), the second row down is at specimen 37, the third row down is at RF lens 207 (LL2) and the bottom row is the EELS spectra at camera 131. FIG. 8A is space charge-dominated without utilizing RF lenses. The uncorrected lengthening in energy ($v_z$) and time (z) leads to smear out in spectral features. FIG. 8B is where only a single RF lens 19 is a monochromator, leading to an increased energy resolution, while the temporal resolution is only moderately improved. FIG. 8C uses a pair of coupled RF lenses 19 and 207 per the present embodiment. Depicted are the phase space representations of electron pulses evolving along a EELS beam column with the present adaptive RF lenses. This illustrates the evolution of the pulse as driven by the present optics and interaction with the specimen, which leads to spreading of the phase space in energy due to EELS processes. Further, FIG. 8C uses the first RF lens (LL1) to temporally compress the pulse, while the second RF lens (LL2) is used to energetically refocusing the pulse's collective energy spread, resulting in the present system's improvements in both time and energy resolutions A prior example of longitudinal electron optics is the radio-frequency cavity in a role as a time compressor or buncher, as has been implemented in ultrafast electron diffraction and accelerator beamlines, such as in commonly owned U.S. Pat. No. 9,024,256. Generally, in this prior scenario, the RF electron optics can be considered as a longitudinal (z) lens. The compression of the electron pulse width is accomplished by shifting the longitudinal chirp of the pulse, from positive to negative. Directed by this negative dispersion, leading and trailing ends of the pulses move towards each other at pulse's rest frame, resulting in pulse contraction.

Figure 6:
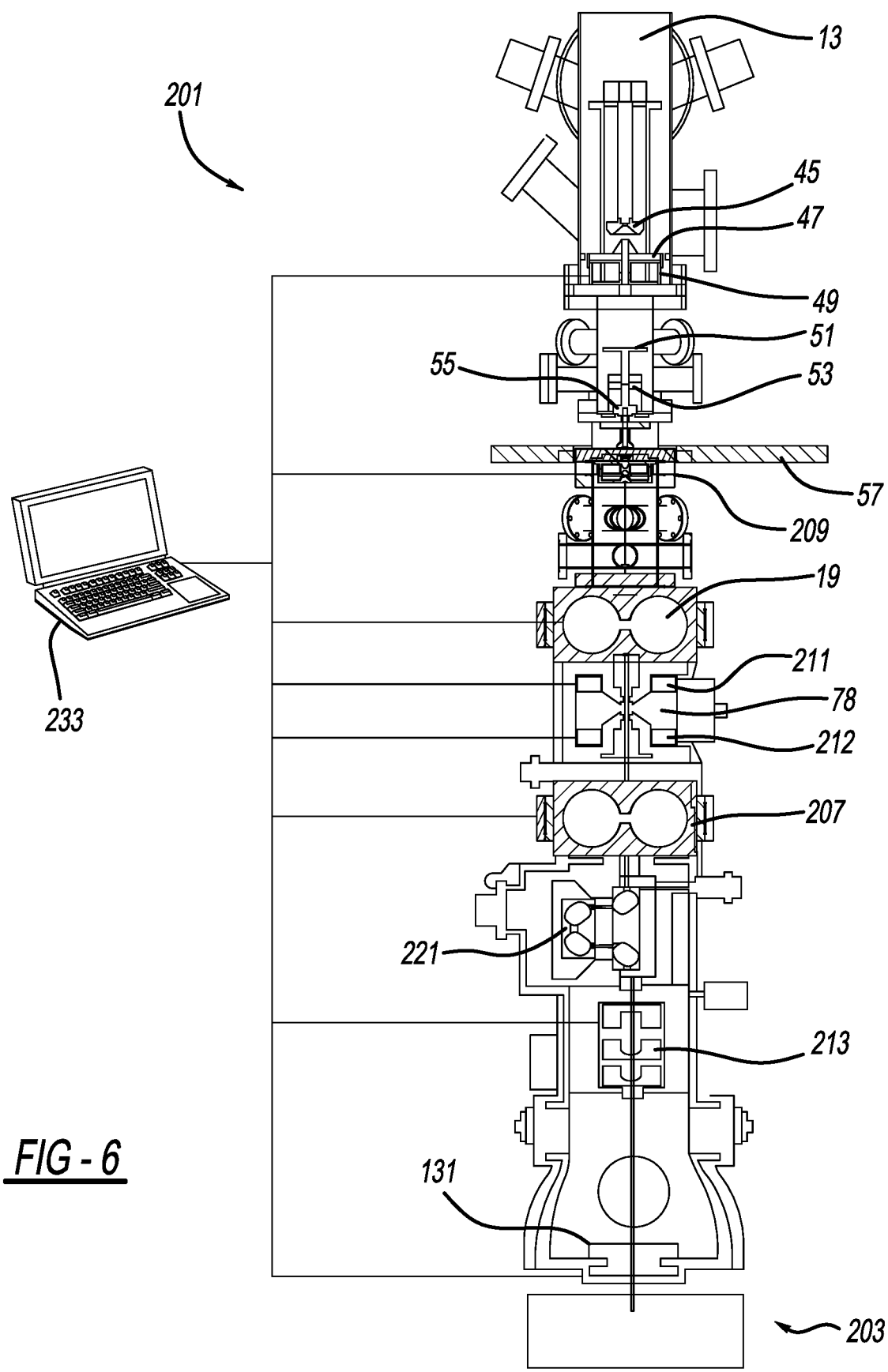
FIG. 6 is a longitudinal sectional view showing a second embodiment of the election spectroscopy system.

Simple examples are shown where in the first instance of correction, depicted in FIG. 8B, an energy compression is reached by adjusting the chirp from positive to zero using the first longitudinal lens 19 (LL1), as is also illustrated in FIGS. 6 and 7A. Unlike the monochromator widely used in a TEM, the monochromatization through the RF longitudinal phase space manipulation improves the energy resolution while preserving the throughput of the beam. For a given emittance, a penalty is taken in the time resolution, due to a complementarity: $\Delta E \Delta t \geq \varepsilon_z \gamma m_0 c$, where γ is the relativistic Lorentz factor, $m_0$ is the electron mass, and c is the speed of light.

In comparison, the present design uses at least two longitudinal optical elements (e.g., the RF lenses) to perform both time and energy compression, and synergistically couple to transverse focusing optics (e.g., the magnetic lenses) in the TEM. The basic idea behind this strategy is to deploy first longitudinal lens 19 for time-compression and second longitudinal lens 207 (LL2) for reconstructing the post-specimen longitudinal phase space to enhance the spectroscopic signatures carried by the outgoing electron pulses after impacting specimen 37. Unlike in the few-electron UEM or steady-state TEM, the beam dynamics are highly subjective to the density of the pulses. The optical lenses are preferably adaptive in nature and work together in order to optimize the performance in target resolution space.

Reference should now be made to FIGS. 7A-H where the realization of improving time and energy resolutions with adaptive longitudinal optics is depicted in the present TEM system configured for EELS. The left panel in each of FIGS. 7B-H is the phase space evolution in a longitudinal (i.e., beam) direction and the right panel in each of these figures is for the transverse direction thereto. The beam dynamics are simulated using Gaussian pulses with phase space parameters taken from Table 2 as an input into the main TEM column. The expected results are presented in a series of snapshot images of phase space in FIGS. 7B-H. The electron dose, pulse duration, and optical properties delivered to specimen 37 are controlled by a combination of two magnetic lenses 209 and 211 (TL2 and TL3) and RF longitudinal lens 19 (LL1). An RF power of 45 W is used for LL1 with a lens coefficient of 0.0002232 ps$^{-1}$ W$^{-1/2}$, which compresses the pulse from 2.7 ps into 880 fs with $N_e = 10^5$, as can be observed in FIGS. 7B and 7C.

Figure 7B:
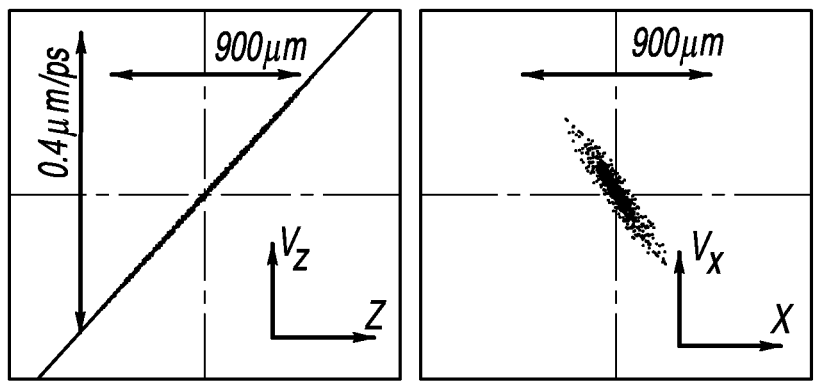
FIGS. 7B-H are sets of phase space evolution images corresponding to the second embodiment of the electron spectroscopy system of FIG. 7A.
Figure 7C:
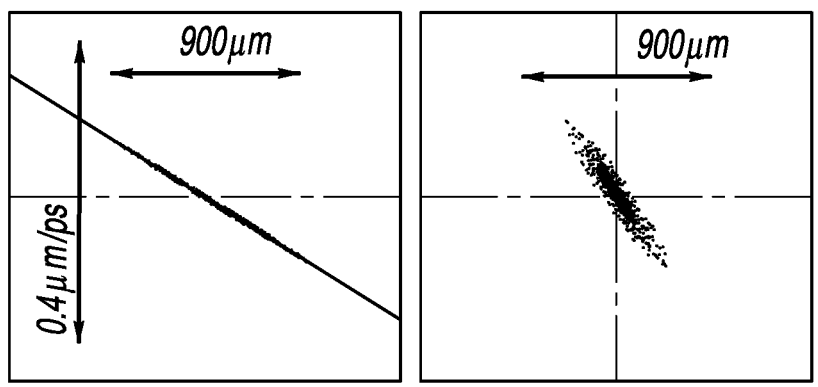
Figure 7D:
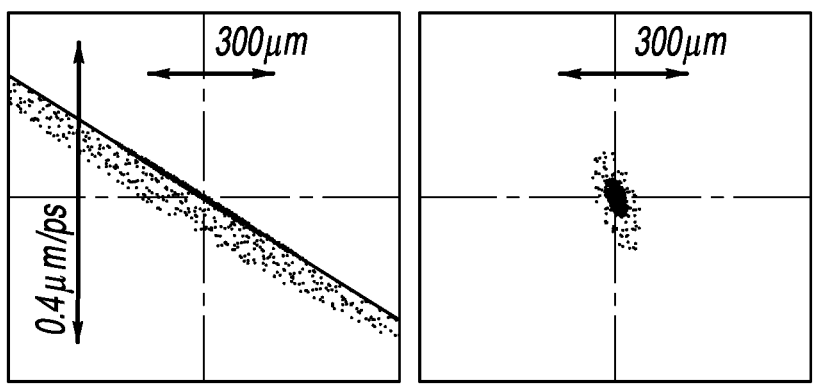
Figure 7E:
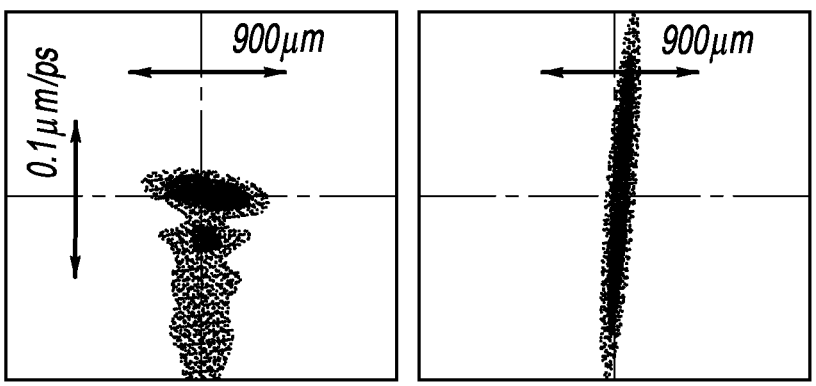
Figure 7F:
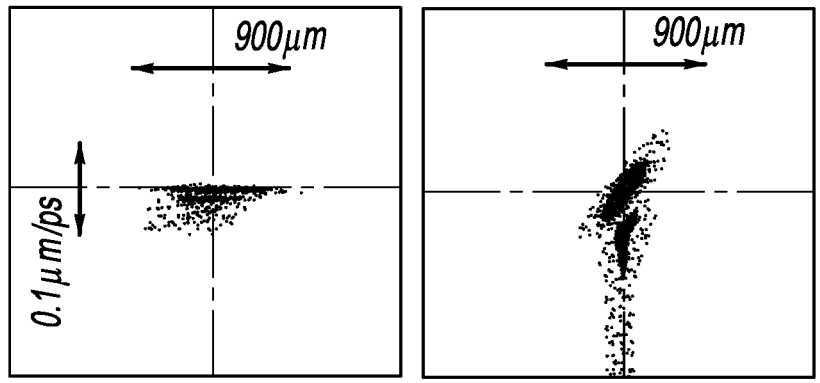
Figure 7G:
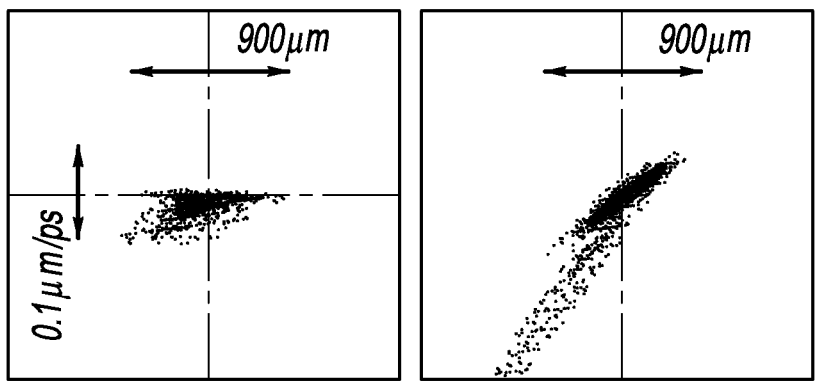
Figure 7H:
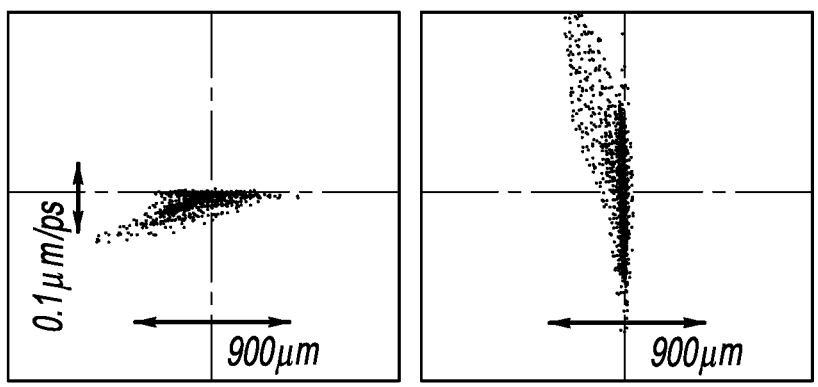

The aberrations associated with the optics in these simulations have been ignored and it is assumed that the lenses behave linearly. To simulate the electron energy-loss process at the samples, the post-specimen phase space is modelled by dividing the phase space into a continuum of phase space streams (slicing number $N_s \geq 500$) based on their respective position within the overall phase space of the electron pulse. The energy-loss process is then replicated in each microscopic phase space with energy shifts adjusted accordingly. Whereas the full post-specimen phase space evolves into a significantly broadened pattern, as shown in FIG. 7D, it should be recognized that the microscopic details of the energy loss are preserved along the $v_z$ axis within each phase space slice at a specific time (or z). The ultimate energy resolution is controlled by the momentary slice energy spread (ξ) carried by individual electrons within the pulse envelope at the pre-specimen stage, rather than the projected one (ΔE) (see FIG. 8A). Post-specimen longitudinal lens 207 (LL2) is utilized to readjust the longitudinal phase space chirp or tilt of the scattered pulses to zero in entering the analyzer plane, as shown in FIG. 7E. The analyzer transversely displaces the microscopic phase spaces by transferring perpendicular momentum according to their respective longitudinal velocities with an efficiency characterized by the dispersion power D≡dE/dx. The transmitted phase space, after a proper focusing from another magnetic lens 213 (TL5), forms a spectroscopic image (see FIG. 7H) at camera detector 131.

Figure 11:
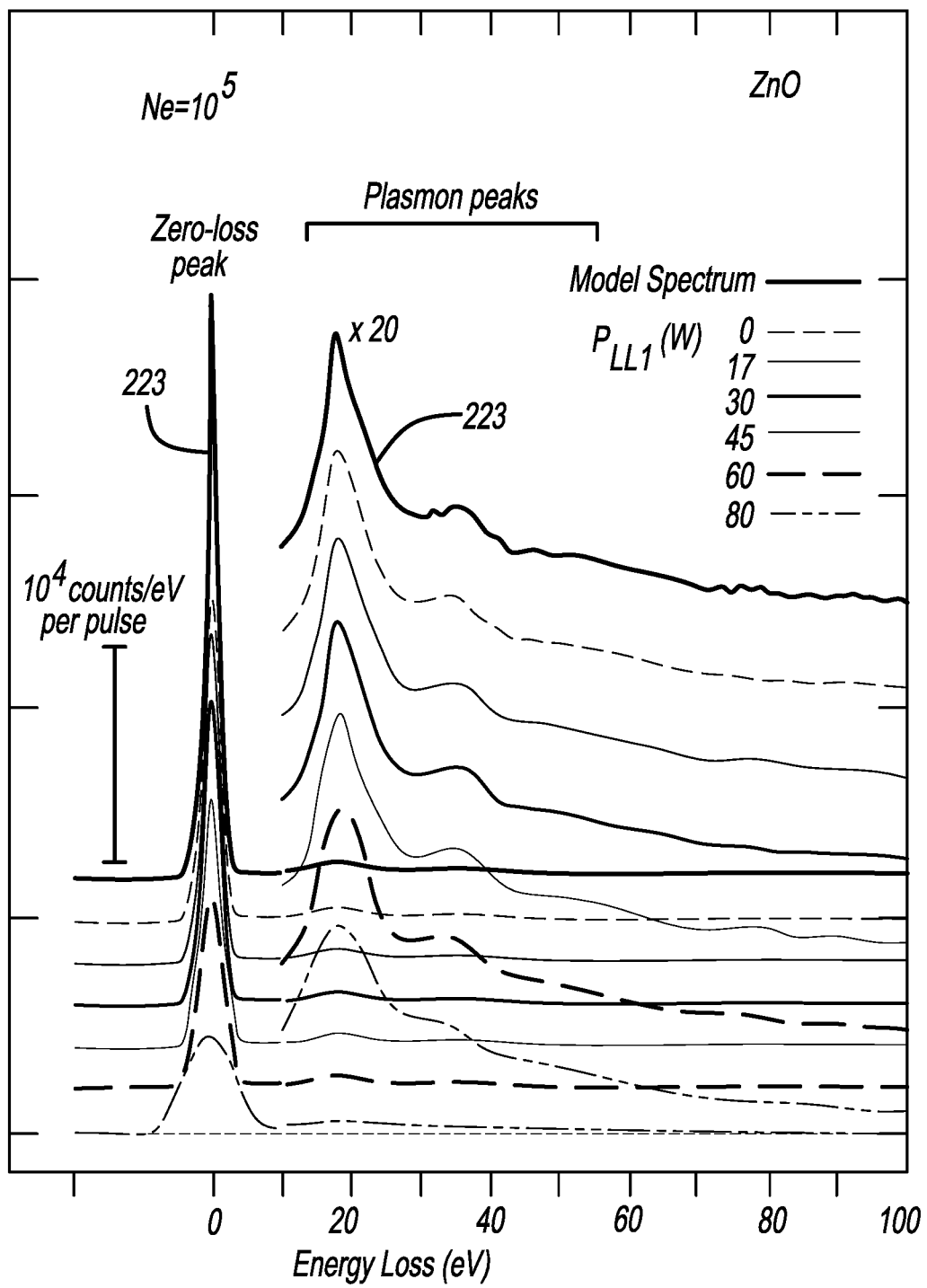
FIG. 11 is a graph showing expected ultrafast EELS spectra of ZnO using the second embodiment of the electron spectroscopy system.

The depiction of the post-specimen phase space presented in FIGS. 7 and 11 is based on the low-loss region of EELS for zinc oxide (ZnO), which is composed of two main features: a prominent zero-loss peak ("ZLP") and plasmon peaks in the range 10-50 eV below ZLP. Such cascaded spectroscopic features can be easily resolved using a modest dispersion power D=5 μm/eV for the analyzer in concert with a properly chosen RF power for LL2. Without further complicating the cases, TL4 was turned off and TL5 (a quadrupole lens) was used to transversely focus the scattered beams onto the camera screen to reduce the nondispersive optical contribution, so the overall energy resolution can be improved.

Figure 9:
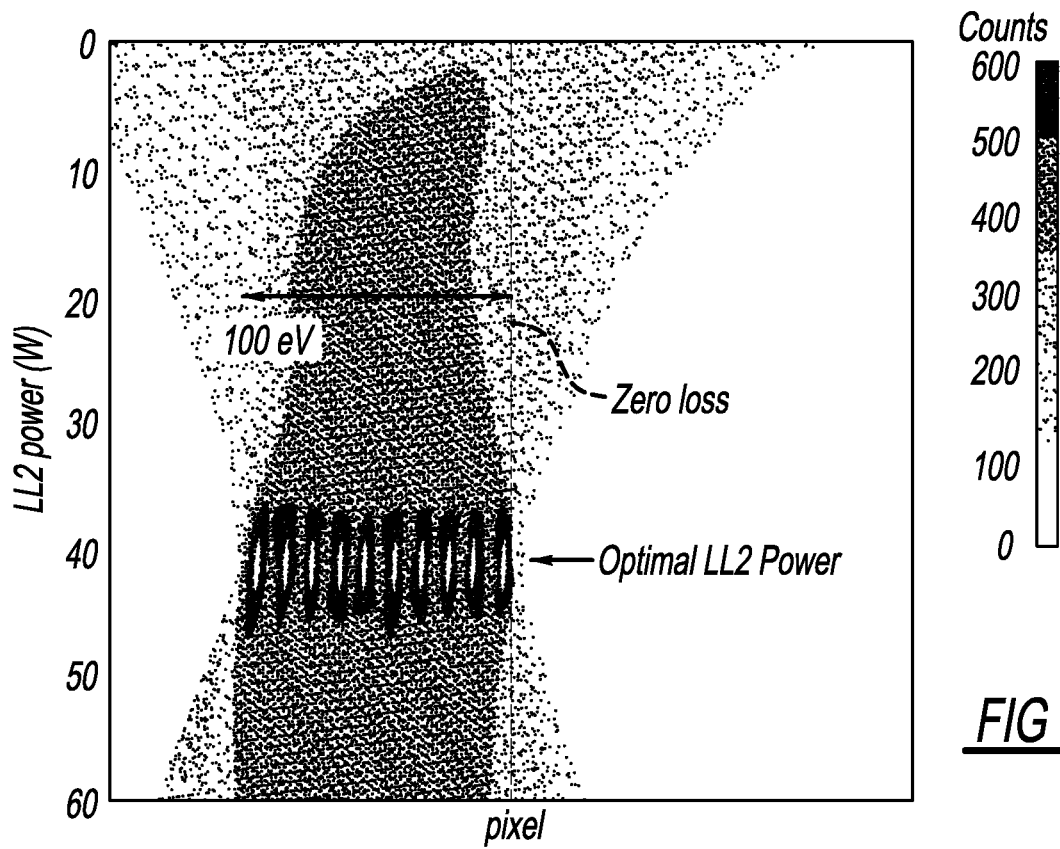
FIG. 9 is an intensity map image of an EELS spectra expected from the second embodiment of the electron spectroscopy system.
Figure 10:
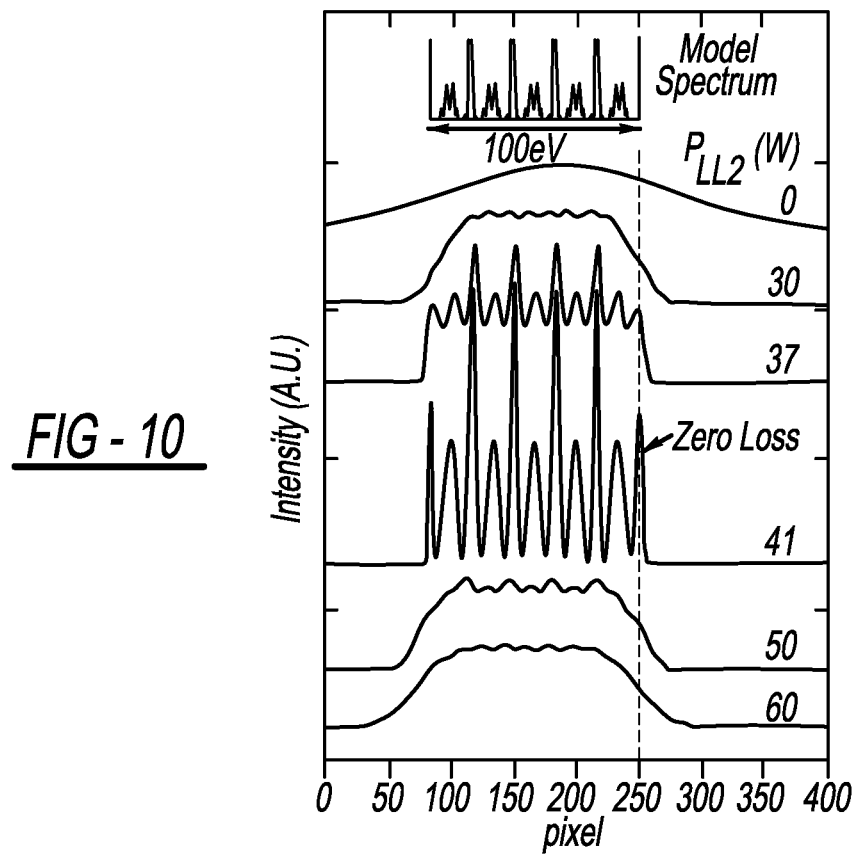
FIG. 10 is a graph representing spectra from the second embodiment of the electron spectroscopy system.

The subtle role of LL2, which has the same lens coefficient as LL1, is demonstrated in a two-dimensional map as shown in FIG. 9 where the vertical axis is the LL2 RF power ($P_{LL2}$) and the corresponding EELS spectra are depicted horizontally in terms of pixel location on a pixelated camera. A periodic model EELS spectrum with sharp (~1 eV) spectral features was useful for illustrating the spectral focusing as illustrated in FIG. 10. As evidenced from the 2D map, the reconstructed phase space forms a sharp spectral pattern only within a narrow window ($P_{LL2} \sim 41 \pm 4$ W). The spectral progression is depicted in FIG. 10 at several selected $P_{LL2}$ to reveal the vastly different degrees of focusing. Away from the optimal setting (~41 W), the signatures of model spectrum completely wash out due to the uncorrected energy spread of the pulses. In other words, the controller and associated software instructions optimize the lens settings to achieve the narrowest pixel EELS spectra for the camera with the greatest intensity at 41 W, for the exemplary configuration shown.

An analyzer is increased to 20 μm/eV to be able to reach an effective resolution close to 1 eV to resolve the model spectral features. The present system advantageously has the ability to reconstruct buried spectral features with the pair of longitudinal lenses 19 and 207. Alternatively, in a different optimization it is possible to significantly improve the sensitivity for probing the challenging core-level spectroscopy with adequate signal-to-noise ratios, as further discussed below.

An EELS simulation is performed to demonstrate the utilities of the present ultrafast EELS technique with adaptive RF optics, taking low-loss and core-loss spectra from zinc oxide (ZnO) and boron nitride (BN) to examine the corresponding S/N and spectral and temporal resolutions under different scenarios. In the ZnO low-loss spectroscopy, different LL1 powers are chosen to deliver temporally compressed pulses, whereas the $P_{LL2}$ power setting is adapted to the evolving phase space to yield the best energy resolution. The time resolution $\Delta t_s$ through compression via LL1 and the energy resolution as characterized by the zero-loss peak (ZLP) width $\Delta E_d$ at the detector are listed in Table 3.

TABLE 3

| Number of electrons/pulse $N_e$ | LL1 RF power $P_{LL1}$ (W) | Pulse-width at sample $\Delta t_s$ (ps) | Energy spread at sample $\Delta E_s$ (eV) | Zero-loss energy at detector $\Delta E_d$ (eV) |
|---|---|---|---|---|
| $10^5$ | 0 | 2.68 | 120 | 1.0 |
| $10^5$ | 17 | 1.59 | 7 | 1.0 |
| $10^5$ | 30 | 1.21 | 32 | 1.1 |
| $10^5$ | 45 | 0.88 | 66 | 1.3 |
| $10^5$ | 60 | 0.60 | 94 | 1.7 |
| $10^5$ | 80 | 0.28 | 127 | 3.4 |
| $10^5$ | 90 | 0.13 | 142 | 8.7 |
| $10^5$ | 95 | 0.063 | 149 | 18.4 |
| $10^6$ | 17 | 4.49 | 3.57 | 5.9 |
| $10^6$ | 30 | 3.36 | 116 | 7.0 |
| $10^6$ | 45 | 2.39 | 215 | 11.0 |

Table 3 depicts ultrafast EELS performance characteristics under different beam intensities and RF optical settings. The vastly improved resolution represented by $\Delta E_d$ as compared to the energy spread $\Delta E_s$ at the specimen is noteworthy. The simulation is based on a model spectrum (see curve 223 in FIG. 11) taken from a conventional TEM-EELS. The EELS cross-section for a 50 nm film and a lateral size of 30 μm is next considered, where the total inelastic scattering cross-section integrated over full energy spectrum amounts to ~50% absorption of the primary electron beam through the sample. The analyzer is increased to 30 μm/eV. The width of ZLP is mainly broadened by the uncorrected space-charge-induced energy spread of the electron pulses, and can be used to gauge the effective resolution delivered by the present electron-optical settings. It can be observed that without further correction, an energy resolution close to 1 eV for temporally compressed pulses with a sensitivity of $10^{2-4}$ counts per eV per pulse can be obtained with $N_e=10^5$. Such resolution can easily resolve the plasmon peaks at 10-50 eV range. These plasmon signatures are representative of the valence charge density of the materials. For insulating ZnO, such excitations are generally weak (multiplied by 20 to enhance the visibility in FIG. 11), but high sensitivity of the present approach allows studies of plasmon dynamics even at single-shots if integrated over several eVs. Furthermore, the ZnO plasmon peaks are discernable with highly compressed pulses with several eV broadening (e.g. $P_{LL1}=80$ W, see Table 3), making femtosecond research of local plasmon dynamics feasible.

Figure 12:
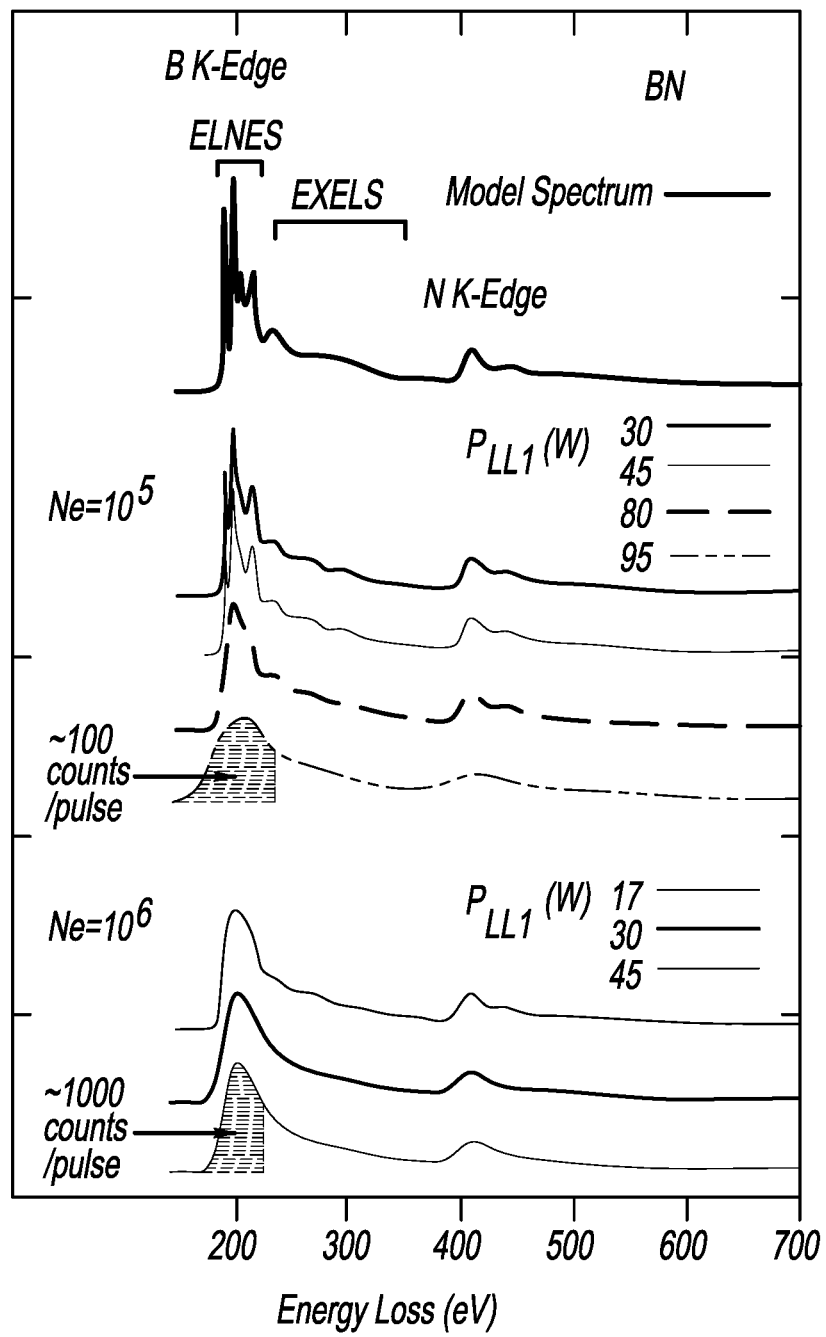
FIG. 12 is a graph showing expected ultrafast EELS spectra of BN using the second embodiment of the electron spectroscopy system.

Ultrafast dynamics at the core-level can be approached with adequate instantaneous doses. Meeting the stringent demand of S/N at a moderate pump-probe repetition rate (~1 kHz or below) advantageously facilitates a broad range of experiments involving chemical and structural transformations in which the core-loss spectra are uniquely sensitive to address. To illustrate such feasibilities, the core-loss spectra of boron nitride (BN) are simulated in FIG. 12. Because of the power-law decay of the cross-section over energy, the typical core-level signal strength is two to three orders of magnitude lower than the low-loss features. Nonetheless, using high-intensity beams with adaptive optics achieves an $S/N \sim N_E^{1/2} > 10^3$, where $N_E$ is the electron counts integrated over the shaded region of the edge state in FIG. 12, at an integration time of 10 sec, while maintaining adequate time and energy resolutions. In particular, the energy-loss near edge structures associated with B or N can be well resolved using lower time compression (e.g., $P_{LL1} \geq 45$ W) with $N_e = 10^5$. For studying the extended energy-loss fine structures, which are sensitive to local structure motifs surrounding each absorbing atom (B or N), lower energy resolution is required. Femtosecond timescale dynamics can be obtained to resolve the extended energy-loss fine structures with a similar acquisition time as in energy-loss near edge structures. Given the unique capability of chemical identifications at core-loss region to address the material transformations under strongly perturbative excitations, single-shot capability is highly desired. To this end, in the lower end FIG. 12 illustrates the expected capability of using $Ne=10^6$ electrons to capture the main signatures of the edge states, rendering adequate S/N for single-shot experiments with few ps resolution. Overall, compared to prior ultrafast electron spectroscopy employed in UEM systems without the present adaptive RF optics, the implementation described herein for the present system represents an expected improvement of sensitivity by four to five orders in magnitude while maintaining similar temporal and spectral resolutions.

In summary, the present system and method substantively increase the sensitivity and resolution associated with an ultrafast electron spectroscopy system through adaptive optics to correct the space-charge effect in a TEM. Energy compression, as a new type of energy filter for condensing the energy spread of the electron pulses to emittance-limited width, is achieved without sacrificing the quantity of electron in a dose or pulse. A serial correction scheme with a pair of RF longitudinal lenses optimizes both the energy and time resolutions. The present system can be custom manufactured or retrofitted into existing TEM systems.

Furthermore, higher energy or time resolution may be accomplished via partially monochromatizing the pre-specimen energy spread leading to a reduction of beam emittance. For example, an emittance reduction by a factor 10 can reach 100 meV-100 fs resolution, which would be commensurate with studying the low-energy electronic processes using optical pump-probe techniques. However, a notable strength of ultrafast EELS with adaptive optics is for imaging of less reproducible element-sensitive chemical dynamics with local bonding information in the ~1 Hz range or even at the single-shot limit through accessing the core-level spectra with a higher single-pulse dose.

Figure 13:
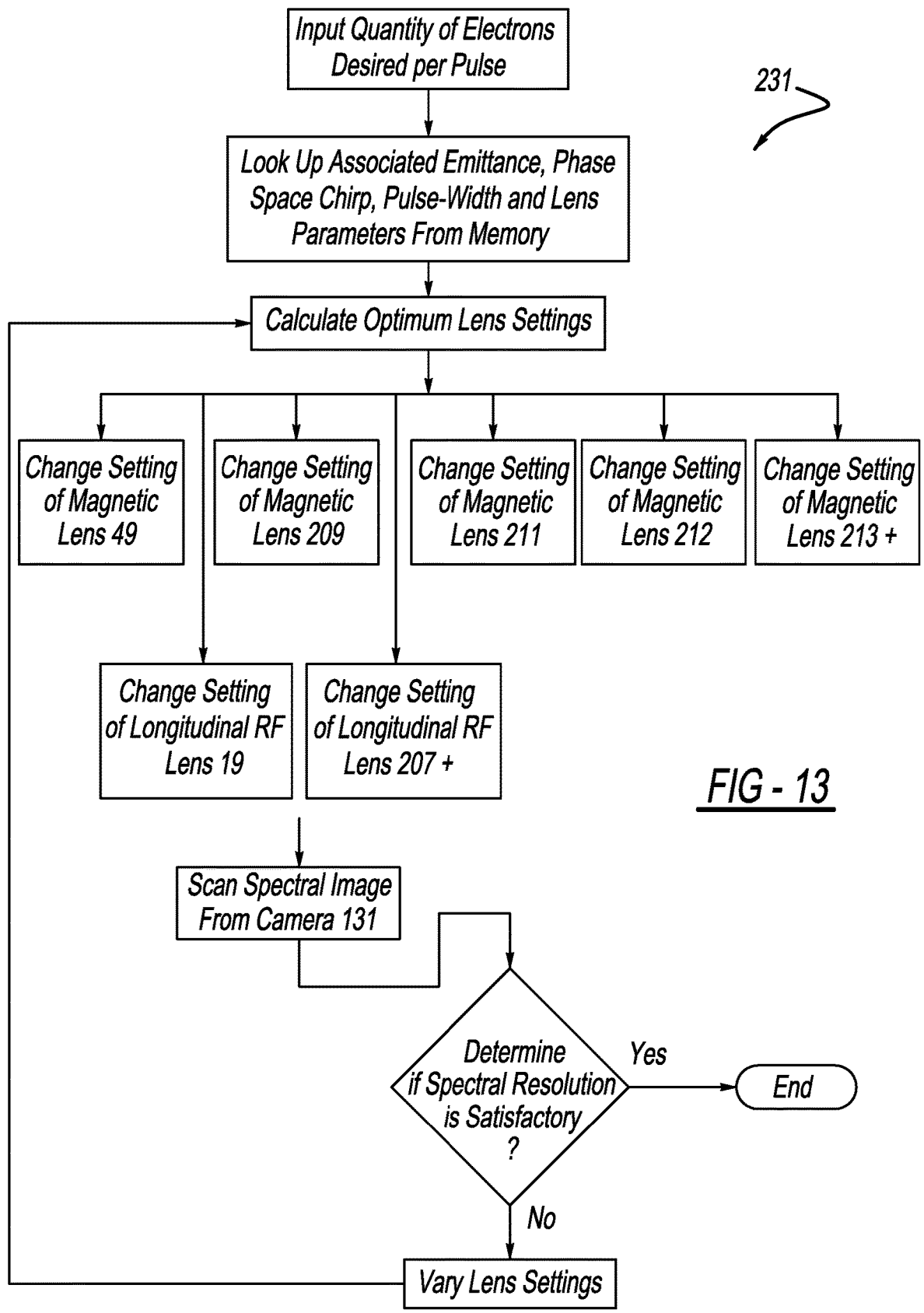
FIG. 13 is a logic flow diagram of software programming instructions employed in the second embodiment of the electron spectroscopy system.

Reference should now be made to FIGS. 6 and 13. Software instructions 231 are programmed into a memory chip or electronic circuit of a computer controller 233. The controller further includes a microprocessor for running the software, an input keyboard and/or switches, and an output display screen and/or printer. Controller 233 is electrically connected to one or more electrical circuits for controlling gun 13, RF lenses 19 and 207, magnetic lens 49, 209, 211, 212 and 213, and camera 131. Software instructions 231 optimize both the time and energy resolutions through real-time changing or varying one or more characteristics associated with one or more of the lenses based on the desired scanned camera image detected. Nonlimiting examples of the adaptive lenses characteristics include increasing/decreasing/turning off/turning on input power, aperture size, tilt, current (for the magnetic lenses), positive or negative phase (for the RF lenses), and the like.

First, the user will manually input the quantity of electrons desired per pulse, which corresponds to the left column of Tables 2 and 3 which were previously stored in look-up RAM in the controller prior to the specimen imaging. This can alternately be automated if an associated desired image resolution category is input instead. Second, the microprocessor will automatically retrieve associated emittance, phase space chirp, pulse-width and lens characteristic parameters or values from the look-up tables or array in the RAM. Third, the software will automatically cause the controller to calculate an optimum parameter setting for any combination of one or more of the lenses based on the prior desired input and stored data. Fourth, the controller will automatically change or keep parameter settings of the magnetic lenses 49, 209, 211, 212 and 213, and the RF cavity lenses 19 and 207. Fifth, the controller or user will cause the electron gun to emit a group of the electrons. Sixth, camera 131 will scan the spectral image of the specimen after the electrons pass through analyzer 81/83 or 221. Seventh, the controller thereafter automatically determines if the desired spectral resolution is obtained. If not, controller 233 will vary various combinations of lens settings in an iterative manner for optimization based on multiple electron shots until such is achieved or the system is manually or automatically stopped. The protocols described here are general. Upon changes in the TEM cathode material or electron gun design, the present phase-space parameters can be recalibrated using the above-mentioned procedures in an iterative manner. A method of operating the programmed controller and electron spectroscopy system is also provided.

While various embodiments have been disclosed, other variations may be employed. For example, different embodiments of the longitudinal lens systems, such as adjusting the longitudinal phase space structures to replace the RF cavities using static electromagnetic fields, may achieve better stabilities in some applications. The RF cavity version of the longitudinal lenses 19 and 207 for the first or second embodiments hereinabove may alternately be replaced by an electrostatic repulsion mirror ("reflectron") or other static lens which manipulates the electrons' velocity and z-direction position. This is contrasted to the magnetic lenses 49, 209, 211, 212, and 213 which transversely focus (position and angle) in the x-y plane. Exemplary reflection pulse compression longitudinal lenses are disclosed in: Flory, C., et al., "Analytic expression for the ideal one-dimensional mirror potential yielding perfect energy focusing in TOF mass spectrometry," International Journal of Mass Spectrometry and Ion Processes, 152 (1996) at 177-184; Kassier, G., et al., "Achromatic reflectron compressor design for bright pulses in femtosecond electron diffraction," Journal of Applied Physics 105 (2009) at 113111; and Grzelakowski, K., et al., "Temporal and lateral electron pulse compression by a compact spherical electrostatic capacitor," Ultramicroscopy 130 (2013) at 36-43. Such an electrostatic repulsion mirror for longitudinal lenses 19 and/or 207 causes the high energy electrons to get closer to the mirror before turning back as compared to lower energy electrons. Since the higher energy electrons travel a longer distance after reflection, it is possible for the lower energy electrons to catch up in time, resulting in a shorter or longitudinally compressed pulse.

Alternate arcuate spectrometer constructions may be used although the results may not be as advantageous. Additional or alternate laser or electron beam optics and electrodes can be employed although some advantages may not be realized. Furthermore, three or more RF cavity lenses and/or more or less than the exemplary five magnetic lenses can be employed in the present system. All of the claims may multiply depend on each other in any combination, and all of the features of the disclosed embodiments may be mixed and matched with each other. It is intended by the following claims to cover these and any other departures from the disclosed embodiments which fall within the true spirit of this invention.

The invention claimed is:

1. An electron spectroscopy system comprising:
 (a) a laser beam;
 (b) an electron gun interacting with the laser beam to emit electrons;
 (c) a radio frequency cavity acting upon the emitted electrons;
 (d) a first spectrometer including electrodes acting to deflect and focus the electrons, the first spectrometer being located downstream of the radio frequency cavity;
 (e) at least a second spectrometer including electrodes acting to deflect and focus the electrons after the first spectrometer, the first and second spectrometers having different internal shapes;
 (f) a specimen receiving area;
 (g) another radio frequency cavity located between the specimen receiving area and the spectrometers; and
 (h) the spectrometers assisting in providing high momentum and high energy ≤1 eV resolution with single-electron counting capability.

2. The system of claim 1, wherein at least one of the spectrometers is a toroidal analyzer including an arcuate cross-sectional path for the electrons between an entrance and an exit thereof, the path being outboard of a longitudinal centerline of the toroidal analyzer.

3. The system of claim 1, wherein at least one of the spectrometers is a spherical analyzer including an arcuate cross-sectional path for the electrons between an entrance and an exit thereof, the path being outboard of a longitudinal centerline of the spherical analyzer.

4. The system of claim 1, wherein:
 the first spectrometer is a toroidal analyzer including at least three electrodes;
 the second spectrometer is a spherical analyzer including at least three electrodes; and
 the electrons follow a substantially curved cross-sectional path from an entrance of the toroidal analyzer to an exit of the spherical analyzer.

17

5. The system of claim 1, wherein there are at least $10^3$ of the electrons emitted per pulse of the laser beam.

6. The system of claim 1, further comprising a CCD camera detecting the energy of the electrons which are received by the camera in at least one ring pattern.

7. The system of claim 1, wherein energy of the electrons is compressed and a time differential of the electrons is elongated due to radio frequency compression and energy filtering.

8. The system of claim 1, further comprising:
a camera;
lenses located between the gun and the camera; and
a programmable controller adjusting at least one characteristic of the lenses and the radio frequency cavities to optimize both time and energy resolutions.

9. The system of claim 1, wherein at least one of the spectrometers provides azimuthal angular magnification to boost transverse momentum transfer of the electron beam.

10. An electron spectroscopy system comprising:
(a) a laser beam;
(b) an electron gun interacting with the laser beam to emit electrons;
(c) a radio frequency cavity acting upon the emitted electrons;
(d) a first spectrometer including electrodes acting to deflect and focus the electrons, the first spectrometer being located downstream of the radio frequency cavity;
(e) at least a second spectrometer including electrodes acting to deflect and focus the electrons after the first spectrometer, the first and second spectrometers having different internal shapes;
(f) the spectrometers assisting in providing high momentum and high energy ≤1 eV resolution with single-electron;
(g) mode-matching optics;
(h) an energy filter;
(i) the electrons being monochromatic without significant loss of the electrons; and
(j) a detector, 2π full-angle electron spectra being received from the second spectrometer as ring patterns by the detector.

11. The system of claim 10, further comprising a second radio frequency cavity located between a specimen receiving area and the spectrometers.

12. The system of claim 10, wherein at least one of the spectrometers is a toroidal analyzer including an arcuate cross-sectional path for the electrons between an entrance and an exit thereof, the path being outboard of a longitudinal centerline of the toroidal analyzer.

13. The system of claim 12, wherein at least one of the spectrometers is a spherical analyzer including an arcuate cross-sectional path for the electrons between an entrance and an exit thereof, the path being outboard of a longitudinal centerline of the spherical analyzer.

14. The system of claim 10, further comprising:
another radio frequency cavity acting upon the electrons, located downstream of the first spectrometer;
lenses located between the gun and the detector; and
a programmable controller adjusting at least one characteristic of the lenses and the radio frequency cavities to optimize both time and energy resolutions.

15. An electron spectroscopy system comprising:
(a) an electron gun emitting at least $10^3$ electrons per bunch;
(b) a radio frequency cavity compressing energy and elongating a time differential of the bunch of the emitted electrons to produce a monochromatic electron beam without loss of the electrons;
(c) multiple aligned spectrometers deflecting the electron beam along arcuate paths and focusing the electron beam;
(d) specimen receiving area; and
(e) another radio frequency cavity located between the specimen receiving area and the spectrometers.

16. The system of claim 15, wherein at least one of the spectrometers is a toroidal analyzer including at least one of the paths located outboard of a longitudinal centerline of the toroidal analyzer.

17. The system of claim 16, wherein at least one of the spectrometers is a spherical analyzer including at least one of the paths located outboard of a longitudinal centerline of the spherical analyzer.

18. The system of claim 15, further comprising:
a laser operable to emit a shaped 1 ps or faster duration laser pulse to the electron gun; and
a detector receiving a 2π full-angle electron spectra from the spectrometers as ring patterns.

19. An electron spectroscopy system comprising:
(a) an electron gun emitting at least $10^3$ electrons per bunch;
(b) a radio frequency cavity compressing energy and elongating a time differential of the bunch of the emitted electrons to produce a monochromatic electron beam without loss of the electrons;
(c) a first spectrometer including a toroidal analyzer including at least three electrodes; and
(d) a second spectrometer including a spherical analyzer including at least three electrodes;
(e) the electrons following a substantially sine-wave cross-sectional path from an entrance of the toroidal analyzer to an exit of the spherical analyzer.

20. The system of claim 19, further comprising a CCD camera detecting the energy of the electrons which are received by the camera in a substantially concentric ring pattern.

21. The system of claim 19, further comprising a second radio frequency cavity located between a specimen receiving area and the spectrometers.

22. The system of claim 19, wherein at least one of the spectrometers provides azimuthal angular magnification to boost transverse momentum transfer of the electron beam.

23. The system of claim 22, further comprising:
a camera;
lenses located between the gun and the camera;
a programmable controller adjusting at least one characteristic of the lenses and the radio frequency cavity to optimize both time and energy resolutions; and
longitudinal centerlines of the spectrometers being linearly and co-axially aligned.

24. An electron spectroscopy system comprising:
(a) an electron gun emitting at least $10^3$ electrons per bunch;
(b) a radio frequency cavity compressing energy and elongating a time differential of the bunch of the emitted electrons to produce a monochromatic electron beam without loss of the electrons;
(c) multiple aligned spectrometers deflecting the electron beam along arcuate paths and focusing the electron beam;
(d) wherein the radio frequency cavity causes an oscillating and phase-locked radio frequency field to rotate a longitudinal phase space of the electrons in the bunch so that a majority of the electrons are squeezed into a narrow energy window and a chirp-axis is aligned with a beam axis, using a correlated space-charge effect to reduce local energy spread to a level of the initial electron emission from the electron gun.

25. The system of claim 24, wherein:
a first of the spectrometers is a toroidal analyzer including at least three electrodes;
a second of the spectrometers is a spherical analyzer including at least three electrodes; and
the electrons follow a substantially curved cross-sectional path from an entrance of the toroidal analyzer to an exit of the spherical analyzer.

26. The system of claim 24, further comprising a second radio frequency cavity located between a specimen receiving area and the spectrometers.

27. The system of claim 26, further comprising:
a camera;
lenses located between the gun and the camera; and
a programmable controller adjusting at least one characteristic of the lenses and the radio frequency cavities to optimize both time and energy resolutions.

28. An electron spectroscopy system comprising:
(a) an electron gun configured to emit electrons;
(b) a radio frequency cavity configured to act upon the emitted electrons;
(c) a first spectrometer including electrodes configured to deflect and focus the electrons, the first spectrometer being located downstream of the radio frequency cavity;
(d) at least a second spectrometer including electrodes configured to deflect and focus the electrons after the first spectrometer, the first and second spectrometers having different internal shapes;
(e) the spectrometers configured to assist in providing resolution with single-electron counting capability;
(f) at least one of the spectrometers being a toroidal analyzer including an arcuate cross-sectional path for the electrons between an entrance and an exit thereof, the path being outboard of a longitudinal centerline of the toroidal analyzer; and
(g) at least one of the spectrometers being a spherical analyzer including an arcuate cross-sectional path for the electrons between an entrance and an exit thereof, the path being outboard of a longitudinal centerline of the spherical analyzer.

29. The system of claim 28, further comprising a second radio frequency cavity located between a specimen receiving area and the spectrometers.

30. The system of claim 29, further comprising:
a camera;
lenses located between the gun and the camera;
a programmable controller adjusting at least one characteristic of the lenses and the radio frequency cavities to optimize both time and energy resolutions; and
the longitudinal centerlines of the analyzers being linearly and co-axially aligned.

31. The system of claim 28, further comprising:
mode-matching optics;
an energy filter;
the electrons being monochromatic without significant loss of the electrons; and
a detector, $2\pi$ full-angle electron spectra being received from the second spectrometer as ring patterns by the detector.

32. The system of claim 28, further comprising:
a CCD camera detecting energy of the electrons which are received by the camera in at least one ring pattern; and
the energy of the electrons being compressed and a time differential of the electrons being elongated due to radio frequency compression and energy filtering.

* * * * *